US012154951B2

(12) United States Patent
More et al.

(10) Patent No.: US 12,154,951 B2
(45) Date of Patent: *Nov. 26, 2024

(54) GERMANIUM TIN GATE-ALL-AROUND DEVICE

(71) Applicant: Taiwan Semiconductor Manufacturing Company, Ltd., Hsinchu (TW)

(72) Inventors: Shahaji B. More, Hsinchu (TW); Cheng-Han Lee, New Taipei (TW); Shih-Chieh Chang, Taipei (TW); Shih-Ya Lin, Chaozhou Township (TW); Chung-En Tsai, Zhubei (TW); Chee-Wee Liu, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/178,893

(22) Filed: Mar. 6, 2023

(65) Prior Publication Data

US 2023/0207634 A1 Jun. 29, 2023

Related U.S. Application Data

(63) Continuation of application No. 17/162,896, filed on Jan. 29, 2021, now Pat. No. 11,600,703.

(51) Int. Cl.
| H01L 29/161 | (2006.01) |
| H01L 29/40 | (2006.01) |
| H01L 29/423 | (2006.01) |
| H01L 29/66 | (2006.01) |
| H01L 29/786 | (2006.01) |

(52) U.S. Cl.
CPC .......... *H01L 29/161* (2013.01); *H01L 29/401* (2013.01); *H01L 29/42392* (2013.01); *H01L 29/66742* (2013.01); *H01L 29/78696* (2013.01)

(58) Field of Classification Search
CPC ................. H01L 29/161; H01L 29/401; H01L 29/42392; H01L 29/66742; H01L 29/78696; H01L 29/0669; H01L 29/1033; H01L 29/66795; H01L 29/785
USPC ....................................................... 257/401
See application file for complete search history.

(56) References Cited

U.S. PATENT DOCUMENTS

| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |

(Continued)

*Primary Examiner* — Tong-Ho Kim
(74) *Attorney, Agent, or Firm* — Sterne, Kessler, Goldstein & Fox P.L.L.C.

(57) ABSTRACT

The present disclosure describes a semiconductor device includes a substrate, a buffer layer on the substrate, and a stacked fin structure on the buffer layer. The buffer layer can include germanium, and the stacked fin structure can include a semiconductor layer with germanium and tin. The semiconductor device further includes a gate structure wrapped around a portion of the semiconductor layer and an epitaxial structure on the buffer layer and in contact with the semiconductor layer. The epitaxial structure includes germanium and tin.

20 Claims, 18 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,831,183 B2 | 11/2017 | Lin et al. |
| 9,859,386 B2 | 1/2018 | Ho et al. |
| 11,600,703 B2 * | 3/2023 | More .................... H01L 29/401 |
| 2014/0001520 A1 | 1/2014 | Glass et al. |
| 2014/0001540 A1 | 1/2014 | Glass et al. |
| 2016/0064221 A1 | 3/2016 | Colinge et al. |
| 2020/0312981 A1 * | 10/2020 | Bomberger ......... H01L 21/0245 |
| 2021/0104522 A1 | 4/2021 | Gardner et al. |

\* cited by examiner

GERMANIUM TIN GATE-ALL-AROUND DEVICE

CROSS-REFERENCE TO RELATED APPLICATION

This application is a continuation application of U.S. patent application Ser. No. 17/162,896, filed on Jan. 29, 2021, titled "Germanium Tin Gate-All-Around Device," the disclosure of which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures.

DETAILED DESCRIPTION

Figure 1:
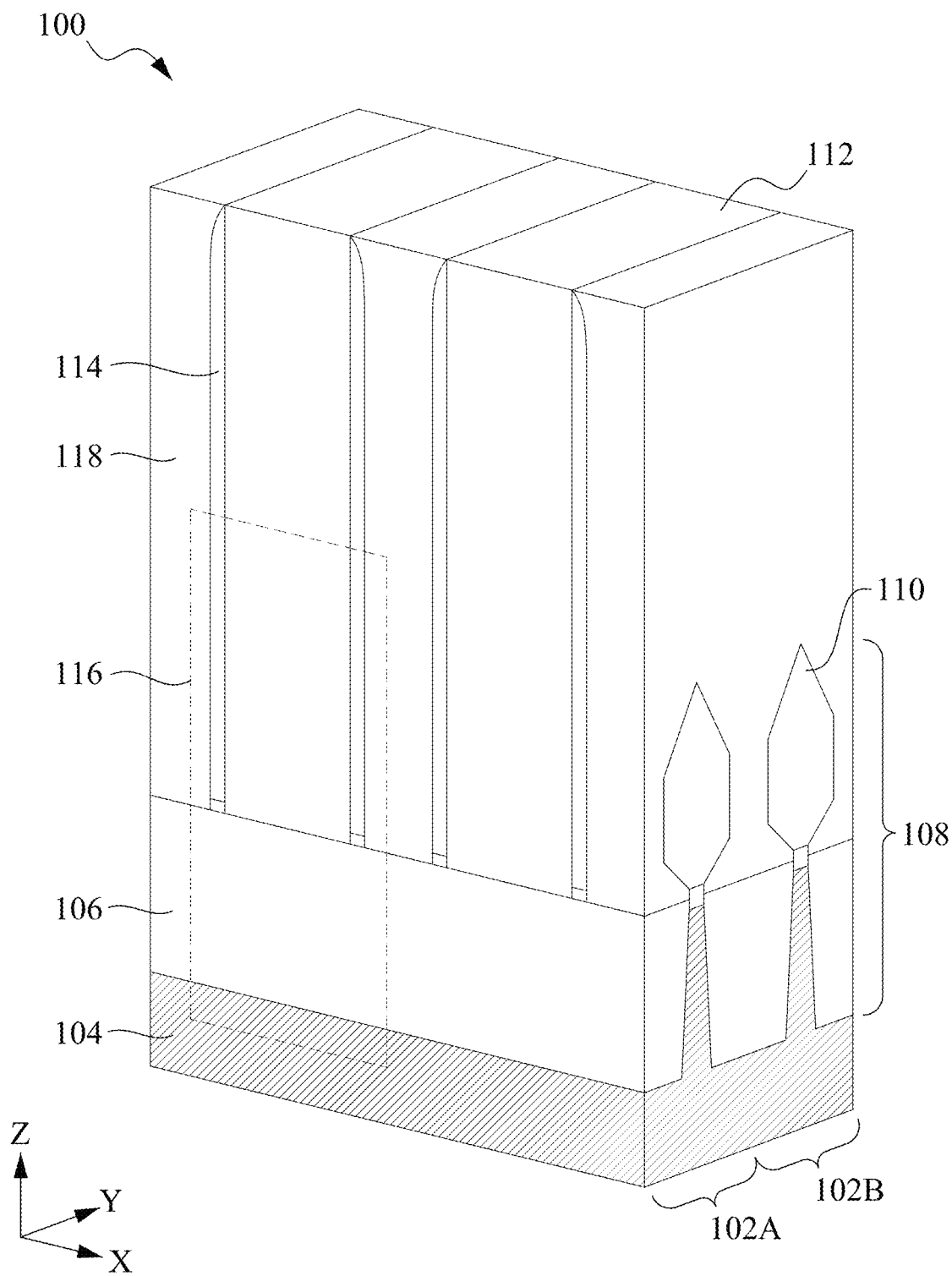
FIGS. 1 and 2 illustrate an isometric view and a partial cross-sectional view of a germanium tin (GeSn) gate-all-around (GAA) semiconductor device, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

With advances in semiconductor technology, multi-gate devices have been introduced in an effort to improve gate control by increasing gate-channel coupling, increase on-state current to off-state current ratio (Ion/Ioff), and reduce short-channel effects (SCEs). One such multi-gate device is the gate-all-around fin field effect transistor (GAA finFET). The GAA finFET device provides a channel in a stacked nanosheet/nanowire configuration. The GAA finFET device derives its name from the gate structure that can extend around the channel and provide gate control of the channel on multiple sides of the channel. GAA finFET devices are compatible with MOSFET manufacturing processes and their structure allows them to be scaled while maintaining gate control and mitigating SCEs.

With increasing demand for lower power consumption, higher performance, and smaller area (collectively referred to as "PPA") of semiconductor devices, GAA finFET devices can have their challenges. For example, for GAA finFET devices formed by silicon (Si) or germanium (Ge) nanosheets/nanowires, Ion/Ioff ratio decreases and SCEs emerge with continuous scaling down of GAA finFET devices. Germanium tin (GeSn) nanosheets/nanowires are desired for higher mobility GAA finFET devices. However, GeSn nanosheets/nanowires and source/drain (S/D) epitaxial structures formed on Si substrates can have dislocation defects and thereby degrade device performance of the GAA finFET devices. In addition, loss of GeSn during the formation of GeSn nanosheets/nanowires can reduce the dimensions of GeSn nanosheets/nanowires and further degrade device performance. Higher etch selectivity is desired for GeSn nanosheets/nanowires formation. The term "etch selectivity" can refer to the ratio of the etch rates of two different materials under the same etching conditions.

Various embodiments in the present disclosure provide methods for forming a GeSn GAA semiconductor device. In some embodiments, the GeSn GAA semiconductor device can include fin structures and S/D epitaxial structures having GeSn. The example methods to form the GeSn GAA semiconductor device can include forming a buffer layer on a substrate. The buffer layer can include Ge to reduce dislocation defects. In some embodiments, the buffer layer can include multiple sublayers having gradient Ge concentrations to further reduce dislocation defects. A stacked fin structure can be formed on the buffer layer and the stacked fin structure can include a first set of semiconductor layers and a second set of semiconductor layers. The first set of semiconductor layers can include Ge and the second set of semiconductor layers can include GeSn. In some embodiments, the second set of semiconductor layers can have a concentration of Sn ranging from about 2% to about 12% to increase carrier mobility, such as hole mobility. In some embodiments, the second set of semiconductor layers can have a concentration of Sn ranging from about 7% to about 10% to increase etching selectivity between GeSn and Ge and improve a process window of the formation of GeSn nanosheets/nanowires. An S/D epitaxial structure can be formed on the buffer layer in contact with the second set of semiconductor layers and a gate structure can wrap around a portion of the second set of semiconductor layers. The S/D epitaxial structure can include GeSn and a dopant. In some embodiments, p-type S/D epitaxial structures can include a p-type dopant, such as boron (B), and n-type S/D epitaxial structures can include an n-type dopant, such as phosphorus (P) and arsenic (As). Compared with Ge, GeSn can increase carrier mobility in the second set of semiconductor layers by about 2 to about 5 times. GeSn GAA semiconductor devices can reduce SCEs and improve device performance. In some embodiments, GeSn GAA semiconductor devices can increase Ion/Ioff ratio by about 3% to about 8% compared to Si- or SiGe-based GAA semiconductor devices.

Figure 2:
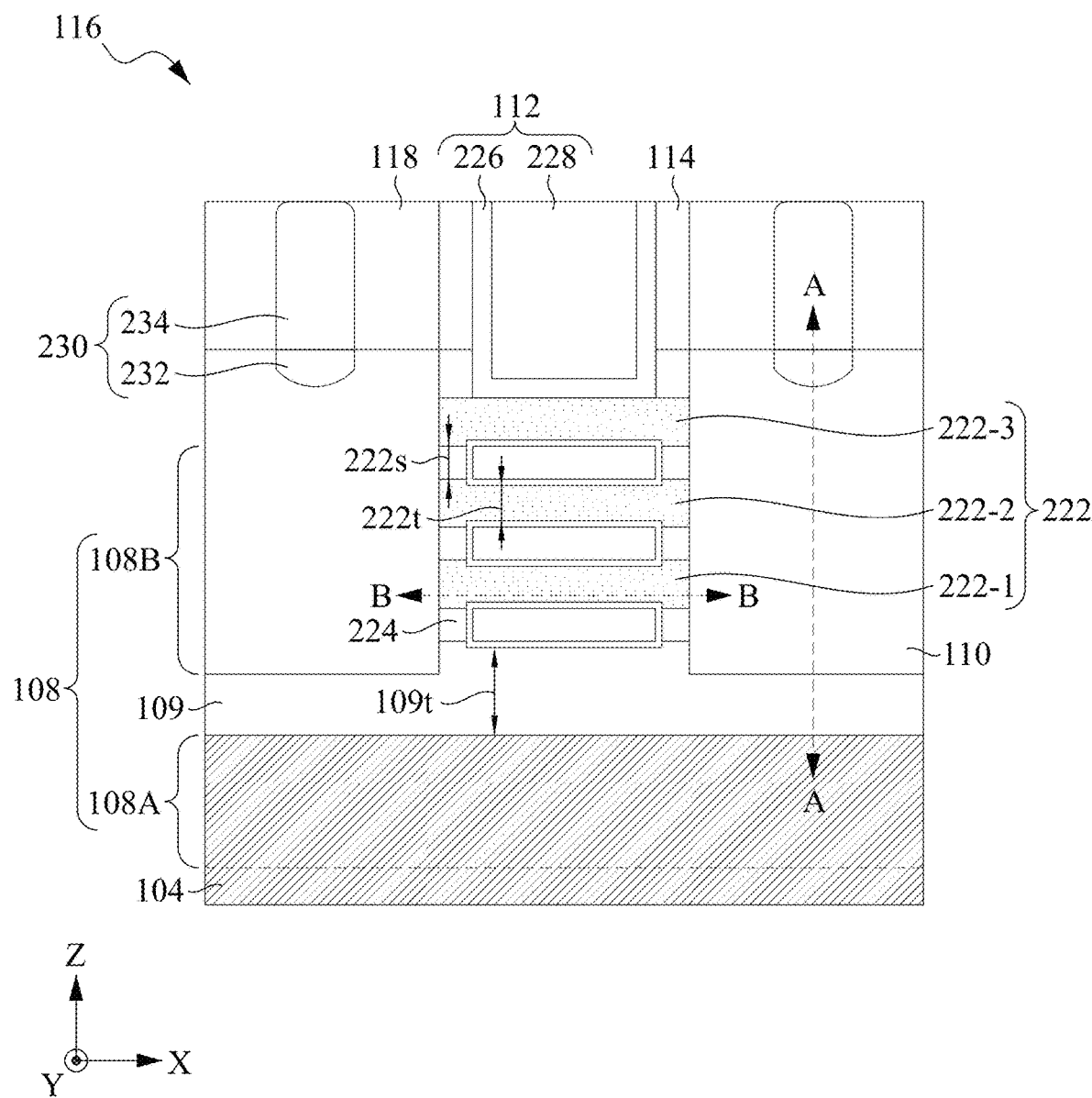
Figure 3:
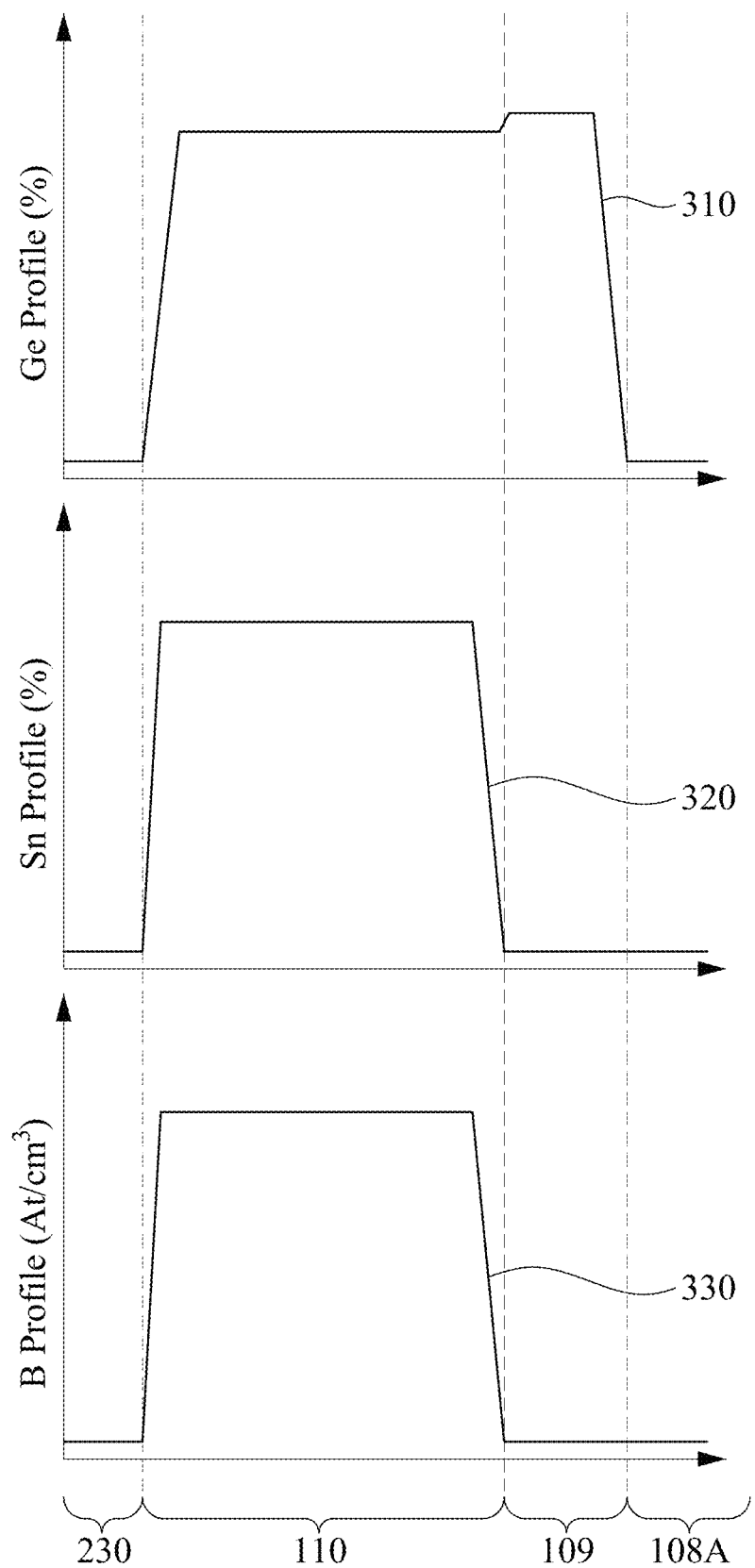
FIGS. 3 and 4 illustrate germanium, tin, and boron profiles along line A-A and line B-B of FIG. 2, in accordance with some embodiments.
Figure 4:
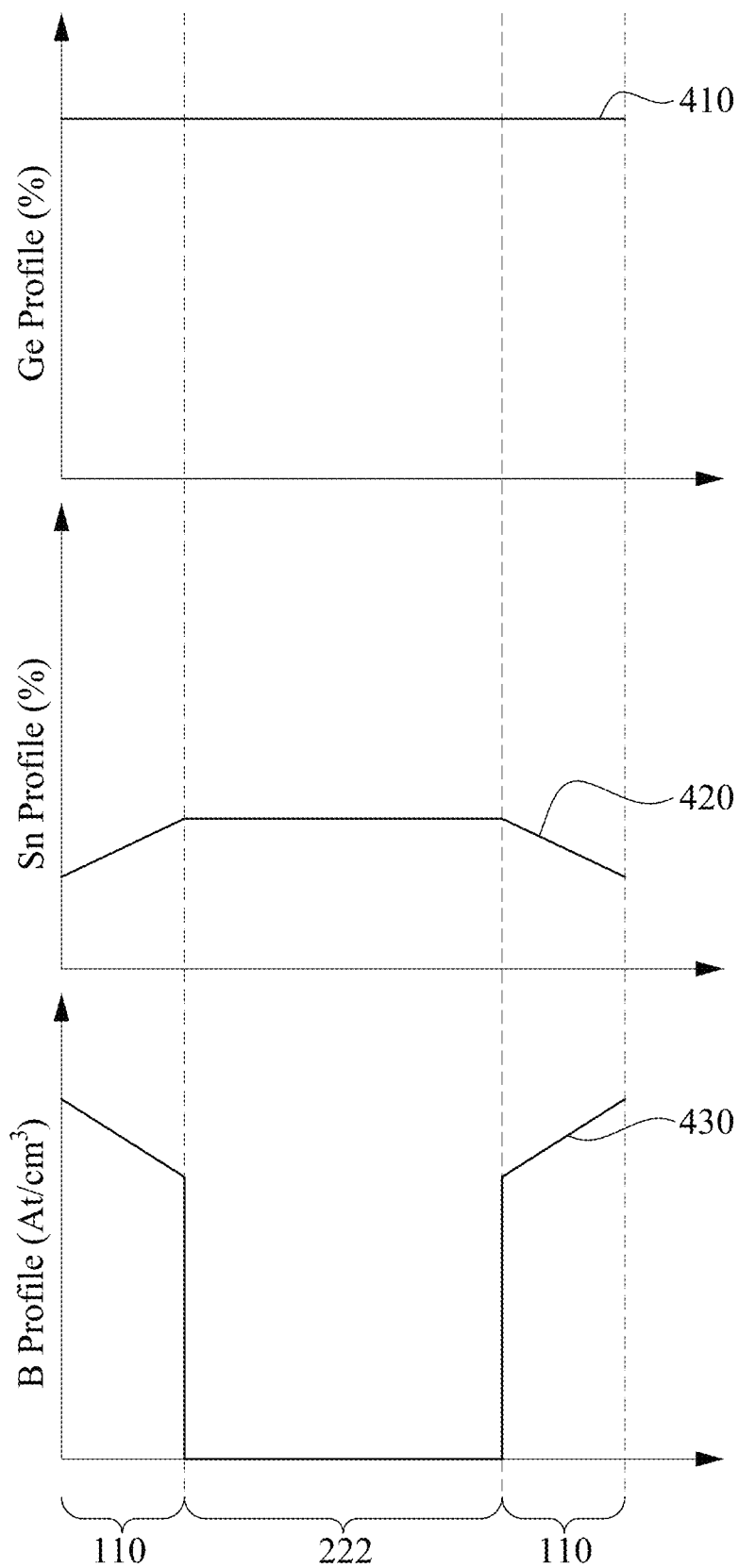

A GeSn GAA semiconductor device 100 having finFETs 102A-102B is described with reference to FIGS. 1-4, according to some embodiments. FIG. 1 illustrates an isometric view of a GeSn GAA semiconductor device 100, according to some embodiments. FIG. 2 illustrates a partial cross-sectional view of region 116 of semiconductor device 100 in FIG. 1 having semiconductor layers 222 of GeSn nanosheets/nanowires as finFET channels, according to some embodiments. Region 116 can be along an X-Z plane through one of fin structures 108 and one of adjacent gate structures 112. FIGS. 3 and 4 illustrate germanium, tin, and boron profiles along line A-A and line B-B in FIG. 2, in accordance with some embodiments. Semiconductor device 100 can be formed on a substrate 104 and can include shallow trench isolation (STI) regions 106, fin structures 108, gate structures 112 disposed on fin structures 108, gate spacers 114 disposed on opposite sides of gate structures 112, S/D epitaxial structures 110, and interlayer dielectric (ILD) layer 118.

In some embodiments, finFETs 102A-102B can be both p-type finFETs (PFETs), both n-type finFETs (NFETS), or one of each conductivity type finFET. Though FIG. 1 shows two GAA finFETs, semiconductor device 100 can have any number of GAA finFETs. In addition, semiconductor device 100 can be incorporated into an integrated circuit (IC) through the use of other structural components, such as contacts, conductive vias, conductive lines, dielectric layers, passivation layers, interconnects, etc., that are not shown for simplicity. The discussion of elements of finFETs 102A-102B with the same annotations applies to each other, unless mentioned otherwise.

Referring to FIGS. 1 and 2, finFETs 102A-102B can be formed on a substrate 104. Substrate 104 can include a semiconductor material, such as silicon (Si). In some embodiments, substrate 104 can include a crystalline silicon substrate (e.g., wafer). In some embodiments, substrate 104 can include (i) an elementary semiconductor, such as germanium (Ge); (ii) a compound semiconductor, such as silicon carbide (SiC); (iii) an alloy semiconductor, such as silicon germanium (SiGe); (iv) a silicon-on-insulator (SOI) structure; (v) a silicon germanium (SiGe)-on insulator structure (SiGeOI); (vi) germanium-on-insulator (GeOI) structure; (vii) a III-V semiconductor, such as gallium nitride (GaN); and (viii) a combination thereof. Further, substrate 104 can be doped depending on design requirements (e.g., p-type substrate or n-type substrate). In some embodiments, substrate 104 can be doped with p-type dopants (e.g., boron, indium, aluminum, or gallium) or n-type dopants (e.g., phosphorus or arsenic).

STI regions 106 can provide electrical isolation between finFET 102A and finFET 102B from each other and from neighboring finFETs with different fin structures (not shown) on substrate 104 and/or neighboring active and passive elements (not shown) integrated with or deposited on substrate 104. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Fin structures 108 can extend along an X-axis and through finFETs 102A-102B. Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Referring to FIGS. 1 and 2, fin structures 108 can include a fin bottom portion 108A, an epitaxial buffer layer 109 disposed on fin bottom portion 108A, and a stacked fin portion 108B disposed on epitaxial buffer layer 109. In some embodiments, fin bottom portion 108A can include material similar to substrate 104. Fin bottom portion 108A can be formed from a photolithographic patterning and an etching of substrate 104. Epitaxial buffer layer 109 can be formed on fin bottom portion 108A and can serve as a base layer for the formation of stacked fin portion 108B. Stacked fin portion 108B can be formed on epitaxial buffer layer 109 and can include a stack of semiconductor layers 222-1, 222-2, and 222-3 (collectively referred to as "semiconductor layers 222"), which can be in the form of nanosheets or nanowires. Each of semiconductor layers 222 can form a channel region underlying gate structures 112 of finFETs 102A-102B.

Epitaxial buffer layer 109 can include semiconductor materials similar to or different from substrate 104. In some embodiments, epitaxial buffer layer 109 can include Ge in a range from about 20 atomic percent to about 100 atomic percent. In some embodiments, epitaxial buffer layer 109 can include multiple sublayers having gradient Ge concentrations from substrate 104 to semiconductor layers 222. For example, epitaxial buffer layer 109 can include a Si sublayer, a SiGe sublayer, and a Ge sublayer. The Si sublayer can include Si and no Ge. The SiGe sublayer can include Ge at a concentration from about 20% to about 90%, such as $Si_{0.3}Ge_{0.7}$ with about 70% Ge. The Ge sublayer can include Ge at a concentration from about 90% to about 100%. In some embodiments, epitaxial buffer layer 109 can reduce dislocation defects due to a lattice mismatch between substrate 104 and semiconductor layers 222 as well as S/D epitaxial structures 110.

Referring to FIG. 2, epitaxial buffer layer 109 can have a vertical dimension 109$t$ (e.g., thickness) along a Z-axis ranging from about 50 nm to about 500 nm. If vertical dimension 109$t$ is less than about 50 nm, semiconductor layers 222 and S/D epitaxial structures may have more epitaxial growth defects, such as dislocation defects. If vertical dimension 109$t$ is greater than about 500 nm, the benefits of epitaxial buffer layer 109 may diminish and the manufacturing cost may increase. In some embodiments, vertical dimension 109$t$ can depend on a number of semiconductor layers 222. Epitaxial buffer layer 109 can have a greater vertical dimension for a larger number of semiconductor layers 222. For example, vertical dimension 109$t$ may range from about 50 nm to about 100 nm for two layers of semiconductor layers 222; and vertical dimension 109$t$ may range from about 100 nm to about 200 nm for four layers of semiconductor layers 222. Other dimensions and materials for epitaxial buffer layer 109 are within the scope and spirit of this disclosure.

Semiconductor layers 222 can include semiconductor materials similar to or different from epitaxial buffer layer 109. In some embodiments, semiconductor layers 222 of n-type GeSn GAA finFETs can include Ge and semiconductor layers 222 of p-type GeSn GAA finFETs can include GeSn having a Sn concentration ranging from about 2% to about 12%. In some embodiments, semiconductor layers 222 of both n-type and p-type GeSn GAA finFETs can include GeSn having a Sn concentration ranging from about 2% to about 12%. GeSn can have higher carrier mobility than Si and Ge, such as hole mobility. For example, compared with Ge, GeSn can increase hole mobility by about 2 times to about 5 times. Higher mobility can increase on-state current (Ion) of FET devices, reduce SCEs, and improve device performance. In some embodiments, GeSn GAA finFETs can improve Ion/Ioff ratio by about 3% to about 8% compared to Si or SiGe based GAA finFETs. In some embodiments, semiconductor layers 222 can include GeSn having a Sn concentration ranging from about 7% to about 10% for a higher etch selectivity. If the Sn concentration is less than about 7%, the etch selectivity may be low (e.g., about 1 to about 3), and the dimensions of semiconductor layers 222 may be reduced and device performance may be degraded. If the Sn concentration is greater than about 10%, the defects in semiconductor layers 222 may increase and device performance may be degraded.

Referring to FIG. 2, semiconductor layers 222 can have a vertical dimension 222$t$ (e.g., thicknesses) along a Z-axis ranging from about 5 nm to about 30 nm. If vertical dimension 222$t$ is less than about 5 nm, device performance of GeSn based GAA semiconductor device may be reduced. If vertical dimension 222$t$ is greater than about 30 nm, semiconductor layers 222 may not provide additional higher mobility and the manufacturing cost may increase. Semiconductor layers 222 can have a vertical dimension 222$s$ (e.g., spacing) along a Z-axis between adjacent semiconductor layers 222 ranging from about 5 nm to about 30 nm. Vertical dimension 222$s$ can have a similar dimension to vertical dimension 222$t$. Other dimensions and materials for semiconductor layers 222 are within the scope and spirit of this disclosure. Though three layers of semiconductor layers 222 are shown in FIG. 2, finFETs 102A-102B can have any number of semiconductor layers 222.

S/D epitaxial structures 110 can be disposed on epitaxial buffer layer 109 and in contact with semiconductor layers 222. In some embodiments, S/D epitaxial structures 110 can have any geometric shape, such as a polygon, a diamond, an ellipsis, and a circle. S/D epitaxial structures 110 can include an epitaxially-grown semiconductor material. In some embodiments, S/D epitaxial structures 110 can be doped with p-type dopants (e.g., boron, indium, aluminum, or gallium) or n-type dopants (e.g., phosphorus or arsenic) during their epitaxial growth. The epitaxially-grown semiconductor material for S/D epitaxial structures 110 can be the same as or different from each other. In some embodiments, the epitaxially-grown semiconductor material in S/D epitaxial structures 110 can be same as semiconductor layers 222. In some embodiments, n-type S/D epitaxial structures 110 can include Ge and p-type S/D epitaxial structures 110 can include GeSn having a Sn concentration ranging from about 2% to about 12%. In some embodiments, both n-type and p-type S/D epitaxial structures 110 can include GeSn having a Sn concentration ranging from about 2% to about 12%.

In some embodiments, S/D epitaxial structures 110 can include multiple epitaxial sub-regions having various concentrations of dopants. For example, S/D epitaxial structures 110 can have a lower dopant concentration in an epitaxial sub-region adjacent to semiconductor layers 222 and epitaxial buffer layer 109 to reduce dopant diffusion to channel regions; and S/D epitaxial structures 110 can have a higher dopant concentration in an epitaxial sub-region adjacent to contact structures 230 to reduce contact resistance. Other materials and dopant concentrations for S/D epitaxial structures 110 are within the scope and spirit of this disclosure.

FIG. 3 illustrate Ge profile 310, Sn profile 320, and B profile 330 along line A-A in FIG. 2, in accordance with some embodiments. As shown in FIG. 3, S/D epitaxial structures 110 can have substantially constant Ge, Sn, and B concentration along line A-A. Epitaxial buffer layer 109 can have a higher Ge concentration than S/D epitaxial structures 110 but substantially no Sn or B. In some embodiments, Sn profile 320 and B profile can be gradient across S/D epitaxial structures 110 (not shown in FIG. 3). For example, S/D epitaxial structures 110 can have a higher B concentration and a lower Sn concentration adjacent to contact structures 230, and can have lower B concentration and higher Sn concentration adjacent to epitaxial buffer layer 109.

FIG. 4 illustrate Ge profile 410, Sn profile 420, and B profile 430 along line B-B in FIG. 2, in accordance with some embodiments. As shown in FIG. 4, S/D epitaxial structures 110 and semiconductor layers 222 can have substantially the same and constant Ge concentration along line B-B. S/D epitaxial structures 110 can have lower Sn concentration and higher B concentration than semiconductor layers 222. Sn concentration and B concentration can be gradient in S/D epitaxial structures 110 along line B-B. For example, Sn concentration in S/D epitaxial structures 110 can decrease with the distance from semiconductor layers 222 along line B-B. B concentration in S/D epitaxial structures 110 can increase with the distance from semiconductor layers 222 along line B-B. Lower B concentration in S/D epitaxial structures 110 adjacent to semiconductor layers 222 can reduce dopant diffusion to semiconductor layers 222 and thereby avoid degradation of device performance. In some embodiments, with substantially constant Ge concentration, Sn concentration in S/D epitaxial structures 110 can decrease with the increase of B concentration. In some embodiments, semiconductor layers 222 can have a substantially constant Sn concentration along line B-B.

Referring to FIGS. 1 and 2, gate structures 112 can be multi-layered structures and can be wrapped around semiconductor layers 222. In some embodiments, each of semiconductor layers 222 can be wrapped around by one of gate structures 112 or one or more layers of gate structures 112, in which gate structures 112 can be referred to as "gate-all-around (GAA) structures" and finFETs 102A and 102B can also be referred to as "GAA FETs 102A-102B" or "GAA finFETs 102A-102B."

Each of gate structures 112 can include a gate dielectric layer 226 disposed on semiconductor layers 222 and a gate electrode 228 disposed on gate dielectric layer 226. Gate dielectric layer 226 can be wrapped around each of semiconductor layers 222, and thus electrically isolate semiconductor layers 222 from each other and from conductive gate electrode 228 to prevent shorting between gate structures 112 and semiconductor layers 222 during operation of finFETs 102A-102B. In some embodiments, gate dielectric layer 226 can include an interfacial layer and a high-k layer. In the field of semiconductor device structures and manufacturing processes, high-k can refer to a dielectric constant that is greater than the dielectric constant of $SiO_2$ (e.g., greater than about 3.9). In some embodiments, the interfacial layer can include silicon oxide or germanium tin oxide ($GeSnO_2$). In some embodiments, the high-k layer can include aluminum oxide ($Al_2O_3$), hafnium oxide ($HfO_2$), zirconium oxide ($ZrO_2$), and/or suitable high-k dielectric materials.

In some embodiments, gate electrode 228 can include a gate barrier layer, a gate work function layer, and a gate metal fill layer. Each of semiconductor layers 222 can be wrapped around by one or more gate barrier layers and one or more gate work function layer. Depending on the space between adjacent semiconductor layers 222 and the thicknesses of the layers of gate structures 112, semiconductor layers 222 can be wrapped around by one or more layers of gate electrode 228, filling the spaces between adjacent semiconductor layers 222. In some embodiments, gate electrode 228 can include aluminum (Al), titanium nitride (TiN), tantalum nitride (TaN), tungsten (W), copper (Cu), and other suitable conductive materials. Though gate structures 112 of finFETs 102A-102B are shown to be similar, finFETs 102A-102B can have gate structures with materials and/or electrical properties (e.g., threshold voltage and work function value) different from each other. Also, though gate structures 112 are shown to have horizontal GAA structures, other gate structures (e.g., vertical GAA structures) are within the scope and spirit of this disclosure.

Referring to FIGS. 1 and 2, gate spacers 114 can form on sidewalls of gate structures 112 and can be in physical contact with portions of gate dielectric layer 226, according to some embodiments. Gate spacers 114 can include insulating material, such as silicon oxide, silicon nitride, a low-k material, and a combination thereof. Gate spacers 114 can include a single layer or a stack of insulating layers. Gate spacers 114 can have a low-k material with a dielectric constant less than about 3.9 (e.g., about 3.5, about 3.0, or about 2.8).

Referring to FIGS. 1 and 2, ILD layer 118 can be disposed on S/D epitaxial structures 110 and STI regions 106. ILD layer 118 can include a dielectric material deposited using a deposition method suitable for flowable dielectric materials. For example, flowable silicon oxide can be deposited using flowable CVD (FCVD). In some embodiments, the dielectric material can be silicon oxide.

Semiconductor device 100 can include additional elements, such as inner spacer structures 224 and contact structures 230, which are illustrated in FIG. 2. These additional elements of semiconductor device 100 are not shown in FIG. 1 for the sake of clarity. Though FIG. 2 shows inner spacer structures 224 and contact structures 230 formed adjacent to two S/D epitaxial structures 110, these structures can be similarly formed adjacent to other S/D epitaxial structures 110 shown in FIG. 1.

Inner spacer structures 224 can be disposed between semiconductor layers 222 and adjacent to S/D epitaxial structures 110 and gate structures 112. Inner spacer structures 224 can include a dielectric material, such as silicon oxynitride (SiON), silicon carbonitride (SiCN,), silicon oxycarbide (SiOC), silicon oxycarbonitride (SiOCN), silicon nitride ($SiN_x$), silicon oxide ($SiO_x$), and a combination thereof. In some embodiments, inner spacer structures 224 can include a single layer or multiple layers of insulating materials. In some embodiments, inner spacer structures 224 can isolate gate structures 112 and S/D epitaxial structures 110.

Contact structures 230 can be configured to electrically connect S/D epitaxial structures 110 to other elements of semiconductor device 100 and/or of the integrated circuit (not shown). Contact structures 230 can be disposed on and in electrical contact with S/D epitaxial structures 110. In some embodiments, each of Contact structures 230 can include a metal-semiconductor alloy/compound material layer 232 and a metal contact 234.

Metal-semiconductor alloy/compound material layer 232 can be disposed on or within S/D epitaxial structures 110. Metal-semiconductor alloy/compound material layer 232 can provide a low resistance interface between S/D epitaxial structures 110 and metal contact 234. Metal-semiconductor alloy/compound material layer 232 can include a compound of germanium or silicon and a metal, such as titanium (Ti), nickel (Ni), and other suitable metals. In some embodiments, metal-semiconductor alloy/compound material layer 232 can include a metal germanide-dopant complex material that can be formed from dopants included during the formation of metal-semiconductor alloy/compound material layer 232. In some embodiments, metal-semiconductor alloy/compound material layer 232 on n-type S/D epitaxial structures 110 can include TiGe having about 20% to about 30% Ti. In some embodiments, metal-semiconductor alloy/compound material layer 232 on p-type S/D epitaxial structures 110 can include NiGe having about 20% to about 30% Ni. Metal contact 234 can be disposed on metal-semiconductor alloy/compound material layer 232 and can include a metal, such as platinum (Pt), Co, W, Al, ruthenium (Ru), and other suitable metals.

Figure 5:
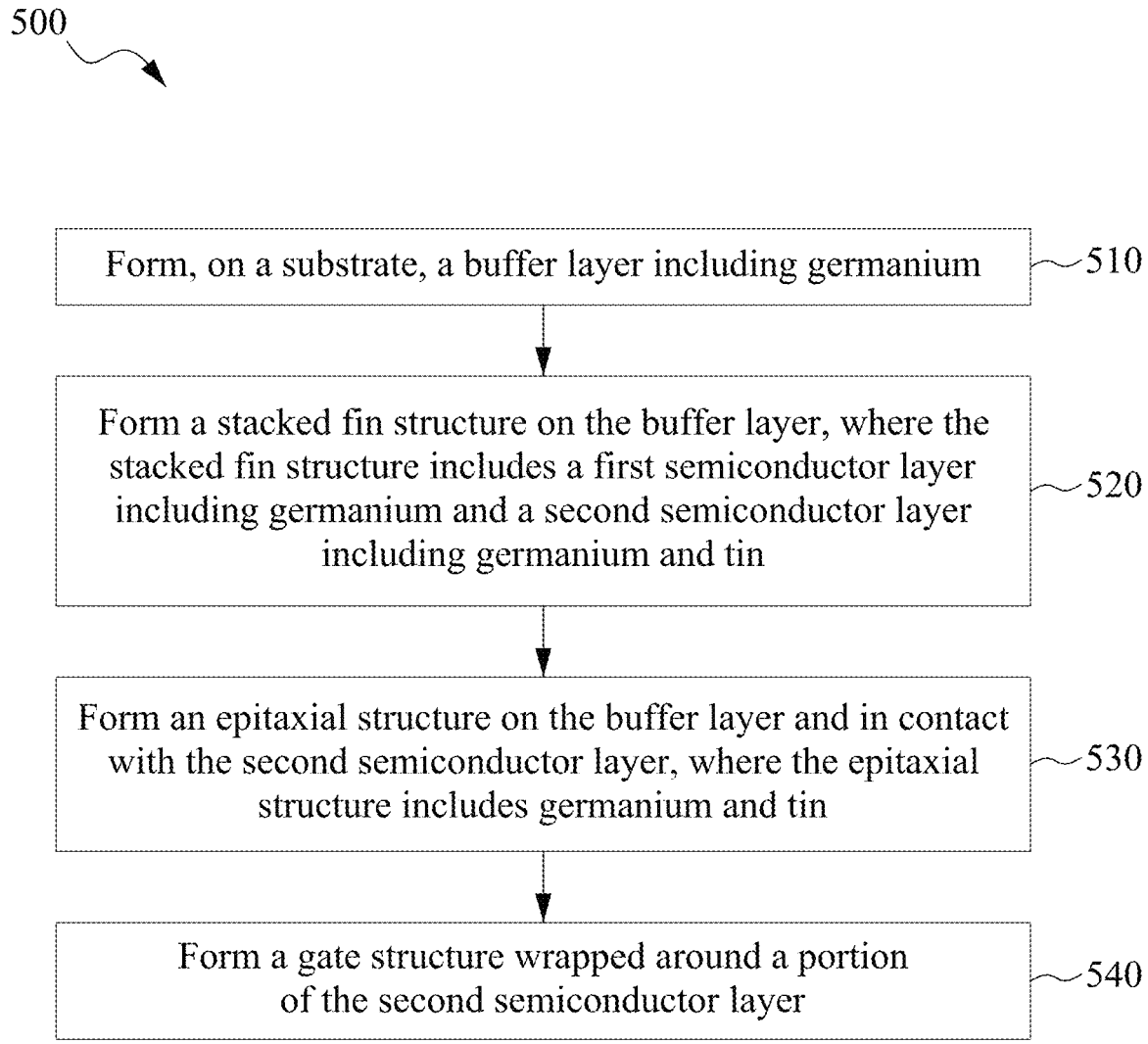
FIG. 5 is a flow diagram of a method for fabricating a GeSn GAA semiconductor device, in accordance with some embodiments.

FIG. 5 is a flow diagram of a method 500 for fabricating GeSn GAA semiconductor device 100, in accordance with some embodiments. Method 500 may not be limited to GAA finFET devices and can be applicable to devices that would benefit from GeSn, such as planar FETs, finFETs, etc. Additional fabrication operations may be performed between various operations of method 500 and may be omitted merely for clarity and ease of description. Additional processes can be provided before, during, and/or after method 500; one or more of these additional processes are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

Figure 6:
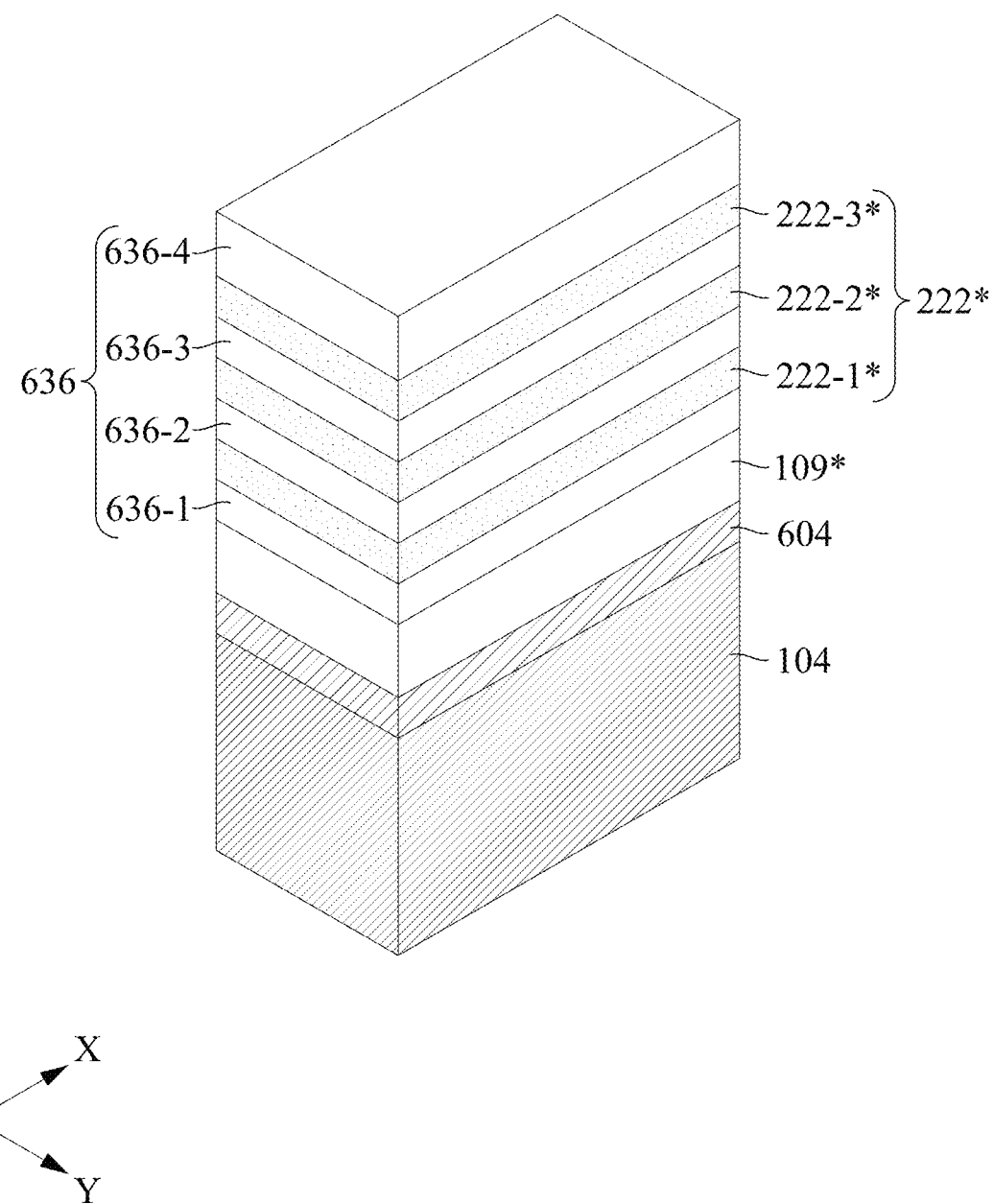
FIGS. 6-7 and 9-18 illustrate partial isometric and cross-sectional views of a GeSn GAA semiconductor device at various stages of its fabrication process, in accordance with some embodiments.
Figure 7:
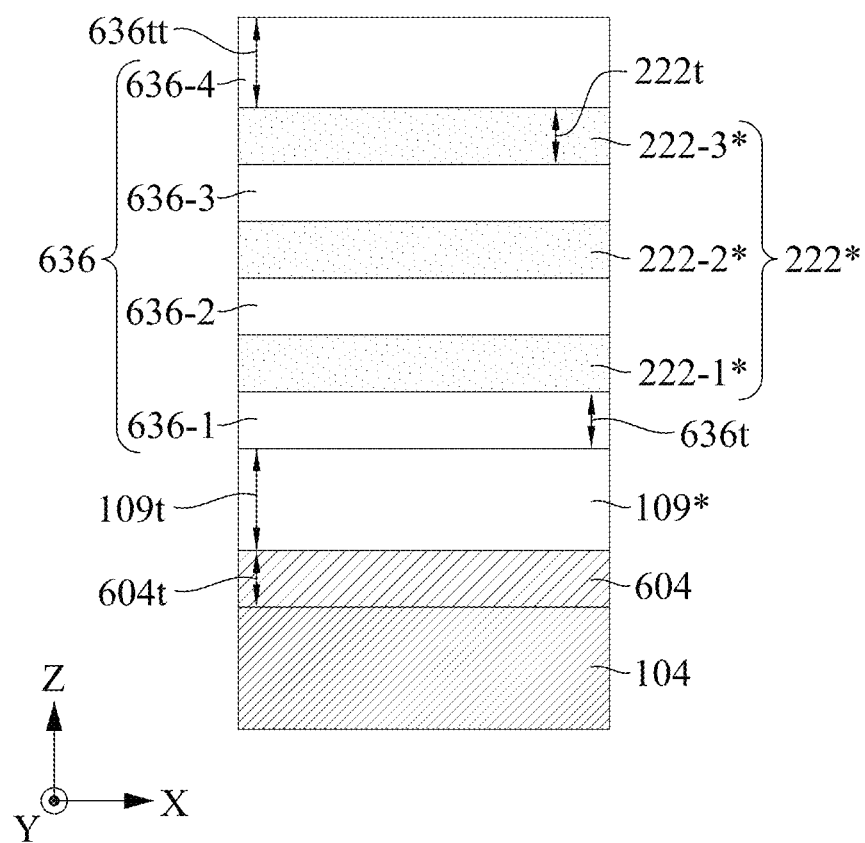
Figure 8:
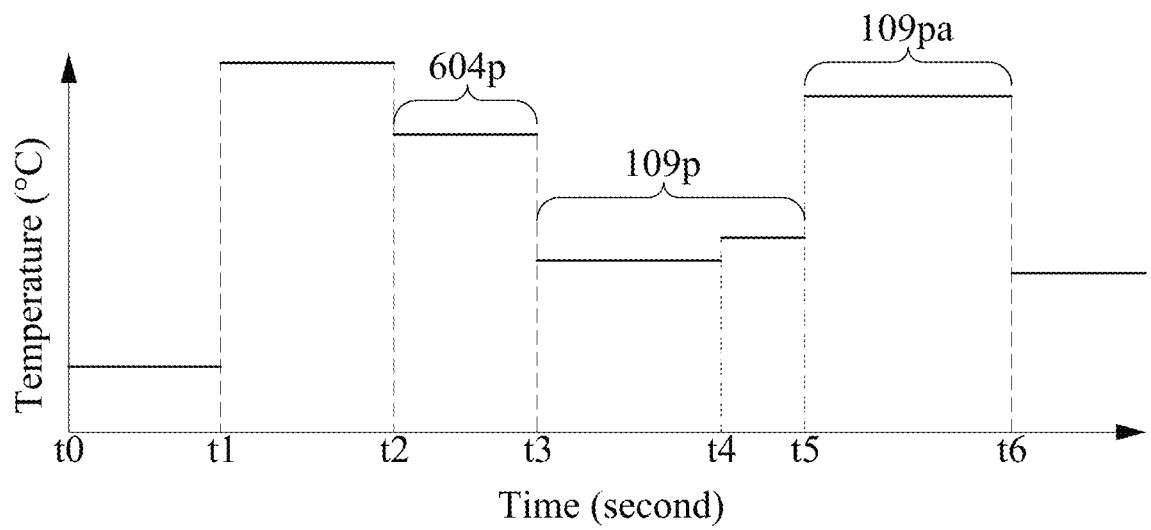
FIG. 8 illustrates process temperatures versus process times for forming a stack of semiconductor layers of a GeSn GAA semiconductor device, in accordance with some embodiments.

For illustrative purposes, the operations illustrated in FIG. 5 will be described with reference to the example fabrication process for fabricating semiconductor device 100 as illustrated in FIGS. 6-18. FIGS. 6-7 and 9-18 illustrate partial isometric and cross-sectional views of semiconductor device 100 at various stages of its fabrication process, in accordance with some embodiments. FIG. 8 illustrates process temperatures versus process times for forming a stack of semiconductor layers of semiconductor device 100, in accordance with some embodiments. Elements in FIGS. 6-18 with the same annotations as elements in FIGS. 1 and 2 are described above.

In referring to FIG. 5, method 500 begins with operation 510 and the process of forming, on a substrate, a buffer layer including germanium. For example, as shown in FIGS. 6 and 7, epitaxial buffer layer 109* can be formed on substrate 104 and can include germanium. Prior to the formation of epitaxial buffer layer 109*, a seed layer 604 can be formed on substrate 104, according to some embodiments. After the formation of epitaxial buffer layer 109*, semiconductor layers 636-1, 636-2, 636-3, and 636-4 (collectively referred to as "semiconductor layers 636") and semiconductor layers 222* can be formed in an alternating configuration. FIG. 8 illustrates process temperatures versus process times for forming seed layer 604, epitaxial buffer layer 109*, semiconductor layers 636 and 222*, according to some embodiments.

Referring to FIG. 8, substrate 104 can be pre-cleaned in a pre-clean chamber with a plasma or a cleaning gas from time t0 to time t1 for a duration of about 50 s to about 200 s to remove surface contamination and native oxides. The plasma and cleaning gas can include hydrogen fluoride (HF), ammonia ($NH_3$), and nitrogen trifluoride ($NF_3$) with carrier gases such as argon (Ar) and hydrogen ($H_2$). The pre-clean process can be performed at a temperature from about 25° C. to about 200° C.

After the pre-clean process, substrate 104 can be moved to an epitaxial growth chamber and can be pre-baked at a temperature from about 800° C. to about 1100° C. from time t1 to time t2 for about 50 s to about 600 s. The pre-bake process can be performed by a rapid thermal anneal (RTA) or other suitable anneal processes. In some embodiments, the pre-bake process can remove residual gases, such as the cleaning gas in the pre-clean process, oxygen, and moisture. In some embodiments, the pre-bake process can also remove damage on surfaces of substrate 104 during the pre-clean process.

Referring to FIG. 8, in a seed layer process 604p, the pre-bake process can be followed by deposition of seed layer 604 shown in FIGS. 6 and 7. Seed layer 604 can be epitaxially grown at a temperature from about 700° C. to about 800° C. from time t2 to time t3 for a duration of about 10 s to about 500 s. Seed layer 604 can be epitaxially grown under a pressure from about 10 torr to about 300 torr. In some embodiments, seed layer 604 can include the same composition as substrate 104, such as Si and SiGe, to reduce surface roughness of substrate 104 and reduce dislocation defects during subsequent growth of epitaxial buffer layer 109*. In some embodiments, seed layer 604 can include SiGe with about 20% to about 30% Ge. In some embodiments, seed layer 604 can have a vertical dimension 604t (e.g., thickness) along a Z-axis ranging from about 10 nm to about 40 nm. If vertical dimension 604t is less than about 10 nm, seed layer 604 may not reduce dislocation defects. If vertical dimension 604t is greater than about 40 nm, the benefits of seed layer 604 may diminish and the manufacturing cost may increase.

The deposition of seed layer 604 can be followed by deposition of epitaxial buffer layer 109* shown in FIGS. 6 and 7. Referring to FIG. 8, in an epitaxial buffer layer process 109p, epitaxial buffer layer 109* can be epitaxially grown at a temperature from about 250° C. to about 500° C. from time t3 to time t5 for a duration of about 10 s to about 1000 s. In some embodiments, epitaxial buffer layer 109* can include Ge to reduce dislocation defects due to a lattice mismatch between substrate 104 and semiconductor layers 636 and 222*. In some embodiments, epitaxial buffer layer 109* can include multiple sublayers having gradient Ge concentrations from seed layer 604 or substrate 104 to semiconductor layers 636 and 222*. For example, as shown in FIG. 8, a first sublayer of epitaxial buffer layer 109* can be deposited from time t3 to time t4 and a second sublayer can be deposited from time t4 to time t5. In some embodiments, epitaxial buffer layer 109* can have a vertical dimension 109t (e.g., thickness) along a Z-axis ranging from about 50 nm to about 500 nm. In some embodiments, vertical dimension 109t can depend on a number of semiconductor layers 222*, as described above.

Referring to FIG. 8, the deposition of epitaxial buffer layer 109* can be followed by an anneal process 109pa to remove dislocation defects in epitaxial buffer layer 109*. The anneal process 109pa can be performed at a temperature from about 600° C. to about 800° C. from time t5 to time t6 for a duration of about 50 s to about 600 s. The anneal process 109pa can be followed by deposition of semiconductor layers 636 and 222* in an alternating configuration as shown in FIGS. 6 and 7. Semiconductor layers 636 and 222* can be epitaxially grown at a temperature from about 250° C. to about 500° C. under a pressure ranging from about 10 torr to about 300 torr. In some embodiments, semiconductor layers 636 and 222* can be epitaxially grown at the same temperature. Semiconductor layers 636 and 222* can be grown by atomic layer deposition (ALD), molecular beam epitaxy (MBE), chemical vapor deposition (CVD), remote plasma CVD (RPCVD), and other suitable deposition methods. Semiconductor layers 636 can include germanium and can be epitaxially grown using precursors including germane ($GeH_4$), digermane ($Ge_2H_6$), hydrogen chloride (HCl), and $H_2$. In some embodiments, semiconductor layers 636 can have a vertical dimension 636t (e.g., thicknesses) along a Z-axis ranging from about 5 nm to about 30 nm. In some embodiments, top semiconductor layer 636-4 can have a greater vertical dimension 636tt (e.g., thicknesses) along a Z-axis ranging from about 20 nm to about 50 nm. Top semiconductor layer 636-4 can act as a capping layer and protect underneath semiconductor layers 636 and 222* during subsequent fin formation process. For example, top semiconductor layer 636-4 can be consumed during a chemical mechanical polishing (CMP) process of subsequent fin formation. Semiconductor layers 222* can include germanium and tin and can be epitaxially grown using precursors including germane ($GeH_4$), digermane ($Ge_2H_6$), tin chloride ($SnCl_4$), hydrogen chloride (HCl), and $H_2$. In some embodiments, semiconductor layers 222* can have a vertical dimension 222t (e.g., thicknesses) along a Z-axis ranging from about 5 nm to about 30 nm.

Figure 9:
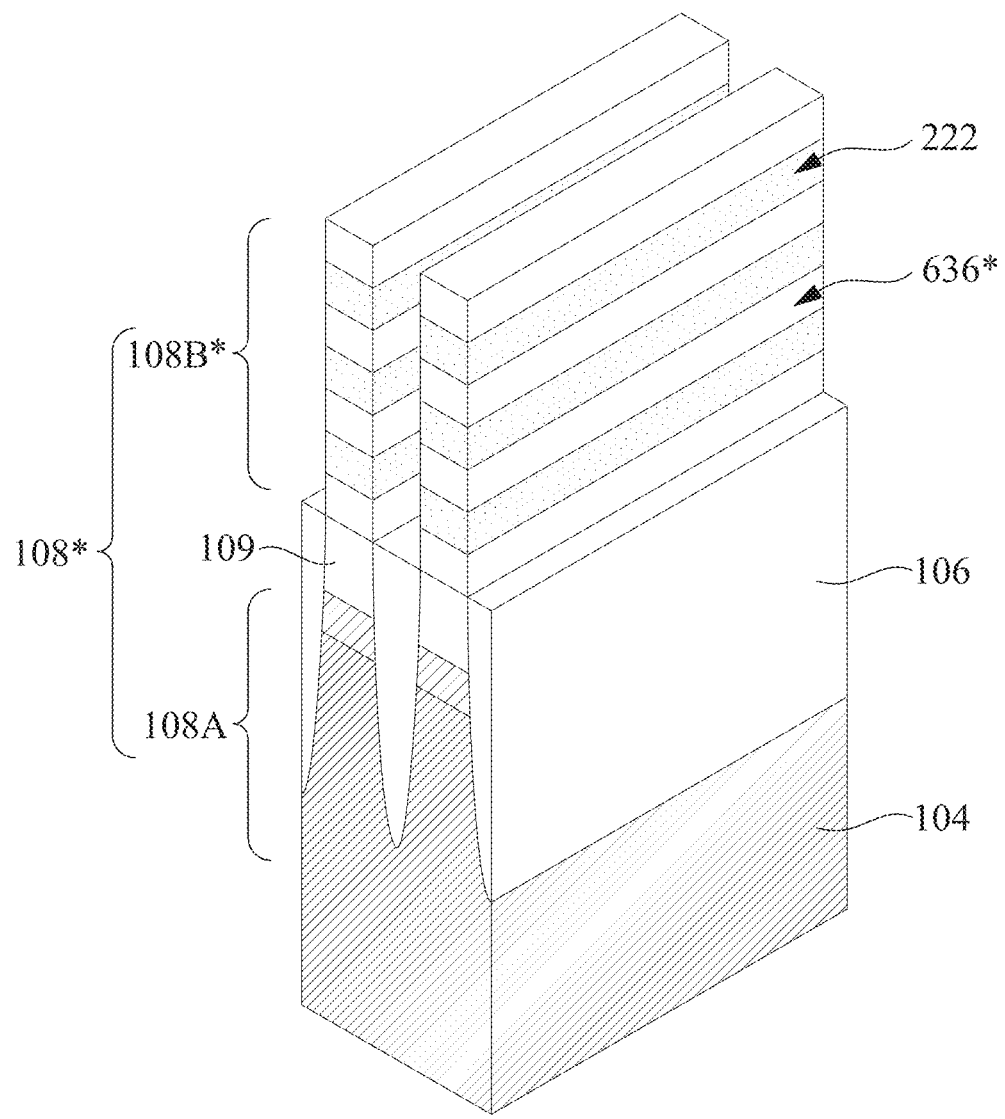

Referring to FIG. 5, in operation 520, a stacked fin structure is formed on the buffer layer. The stacked fin structure includes a first semiconductor layer including germanium and a second semiconductor layer including germanium and tin. For example, as shown in FIG. 9, stacked fin portion 108B* of fin structure 108* can be formed on epitaxial buffer layer 109. Fin structure 108* can be patterned using one or more photolithography processes to etch semiconductor layers 636 and 222*, epitaxial buffer layer 109*, seed layer 604, and substrate 104. STI regions 106 can be formed between adjacent fin structures 108* to isolate them from each other. After the patterning process, fin structure 108* can include fin bottom portion 108A, epitaxial buffer layer 109, and stacked fin portion 108B*. Stacked fin portion 108B* can include semiconductor layers 636* and 222. In some embodiments, semiconductor layers 636* can include germanium and semiconductor layers 222 can include germanium and tin. A concentration of tin in semiconductor layers 222 can range from about 2% to about 12% to increase carrier mobility, such as hole mobility. In some embodiments, the concentration of tin in semiconductor layers 222 can range from about 7% to about 10% to increase etch selectivity between semiconductor layers 636* and 222 in subsequent removal of semiconductor layers 636*.

Figure 10:
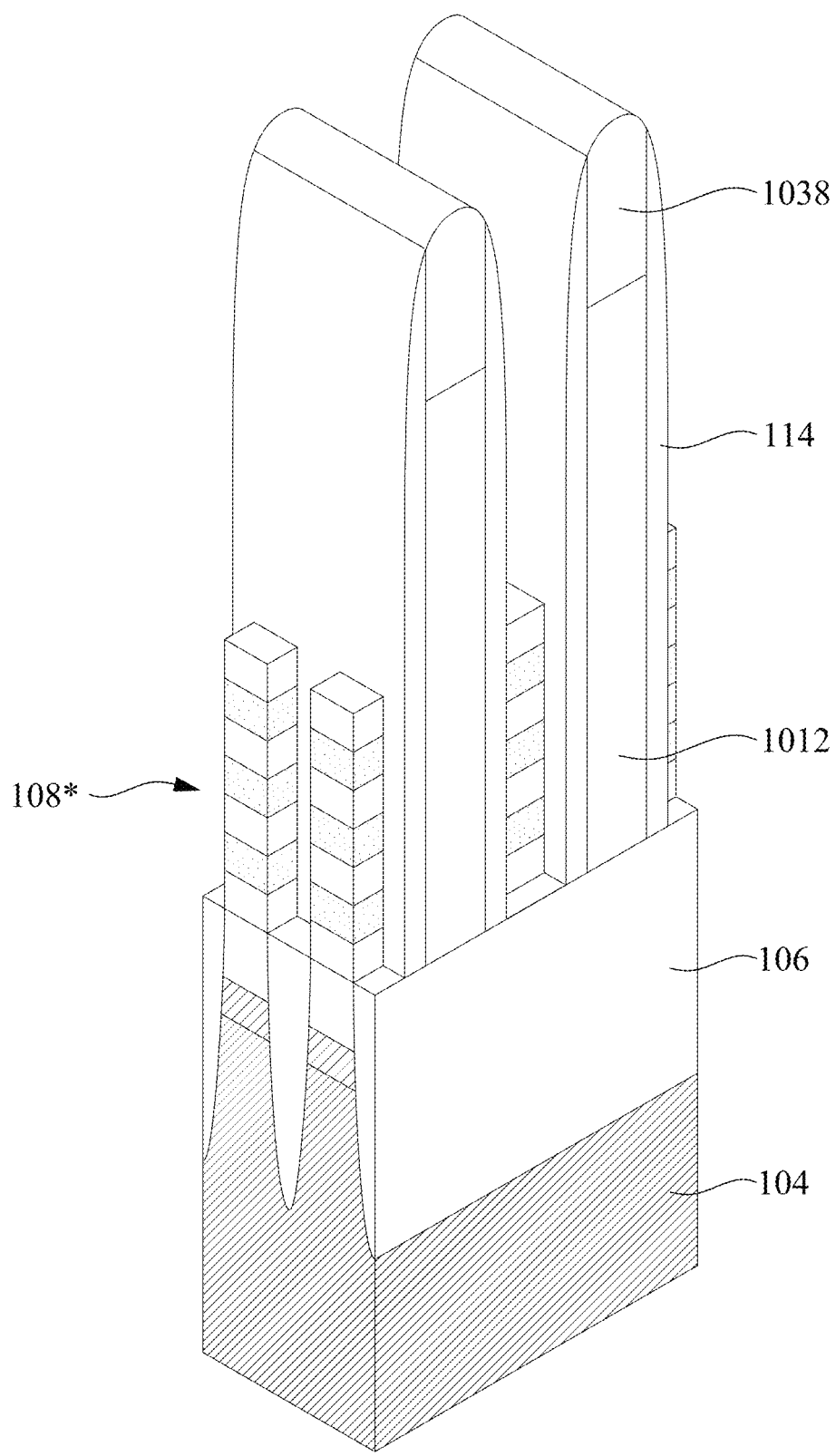

The formation of stacked fin portion 108B* can be followed by formation of sacrificial gate structures 1012, as shown in FIG. 10. Sacrificial gate structures 1012 can be formed on fin structures 108* by a patterning process. In some embodiments, sacrificial gate structures 1012 can include polysilicon. Gate spacers 114 can be formed on sidewalls of sacrificial gate structures 1012 to protect sacrificial gate structures 1012 during their formation process. In some embodiments, gate spacers 114 can include insulating material, such as silicon oxide, silicon nitride, a low-k material, and a combination thereof. Hard mask layer 1038 can be form on top surfaces of sacrificial gate structures 1012 to protect sacrificial gate structures 1012 during their formation process. In some embodiments, hard mask layer 1038 can include silicon nitride and other suitable dielectric materials.

Figure 11:
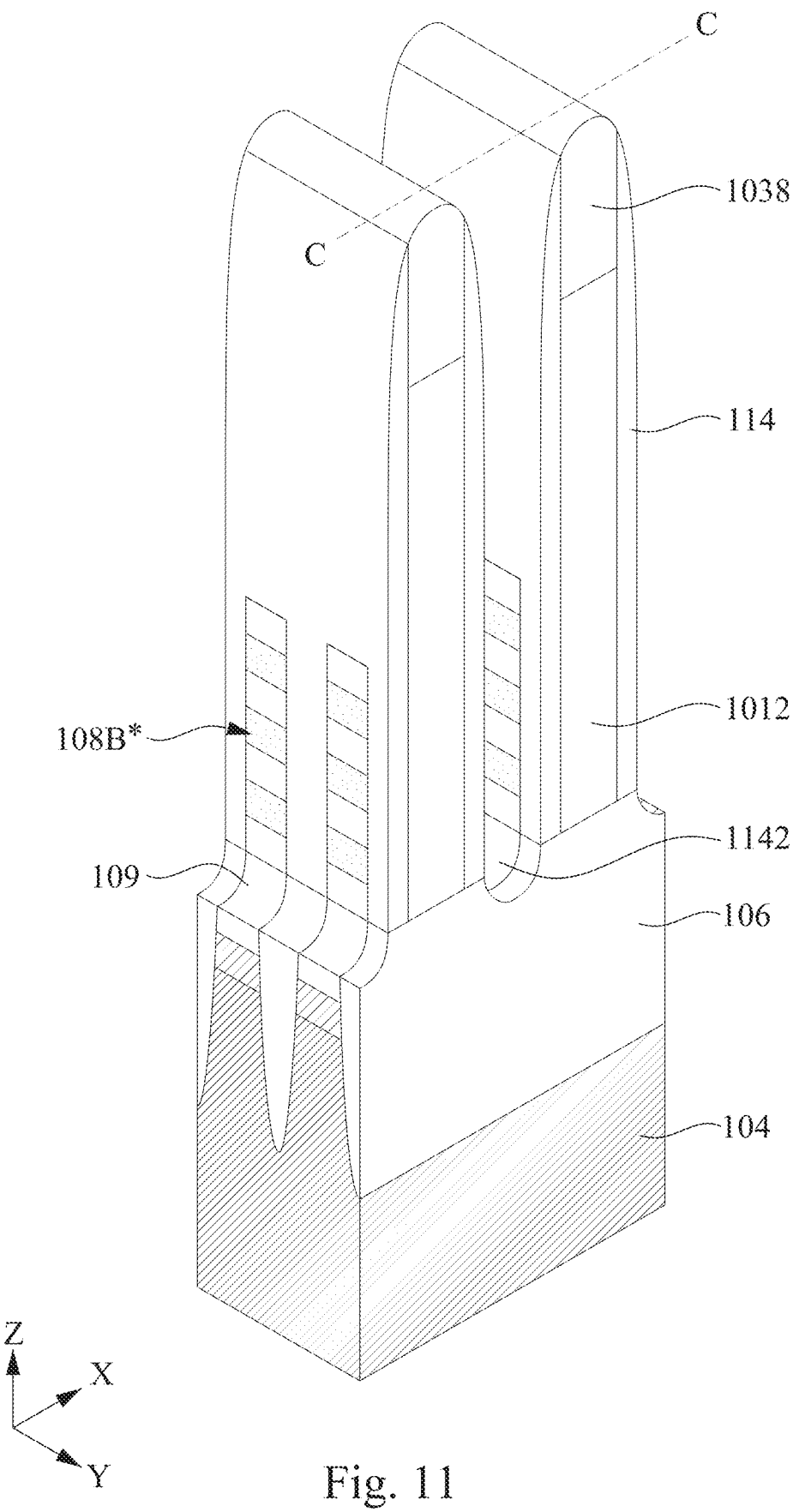
Figure 12:
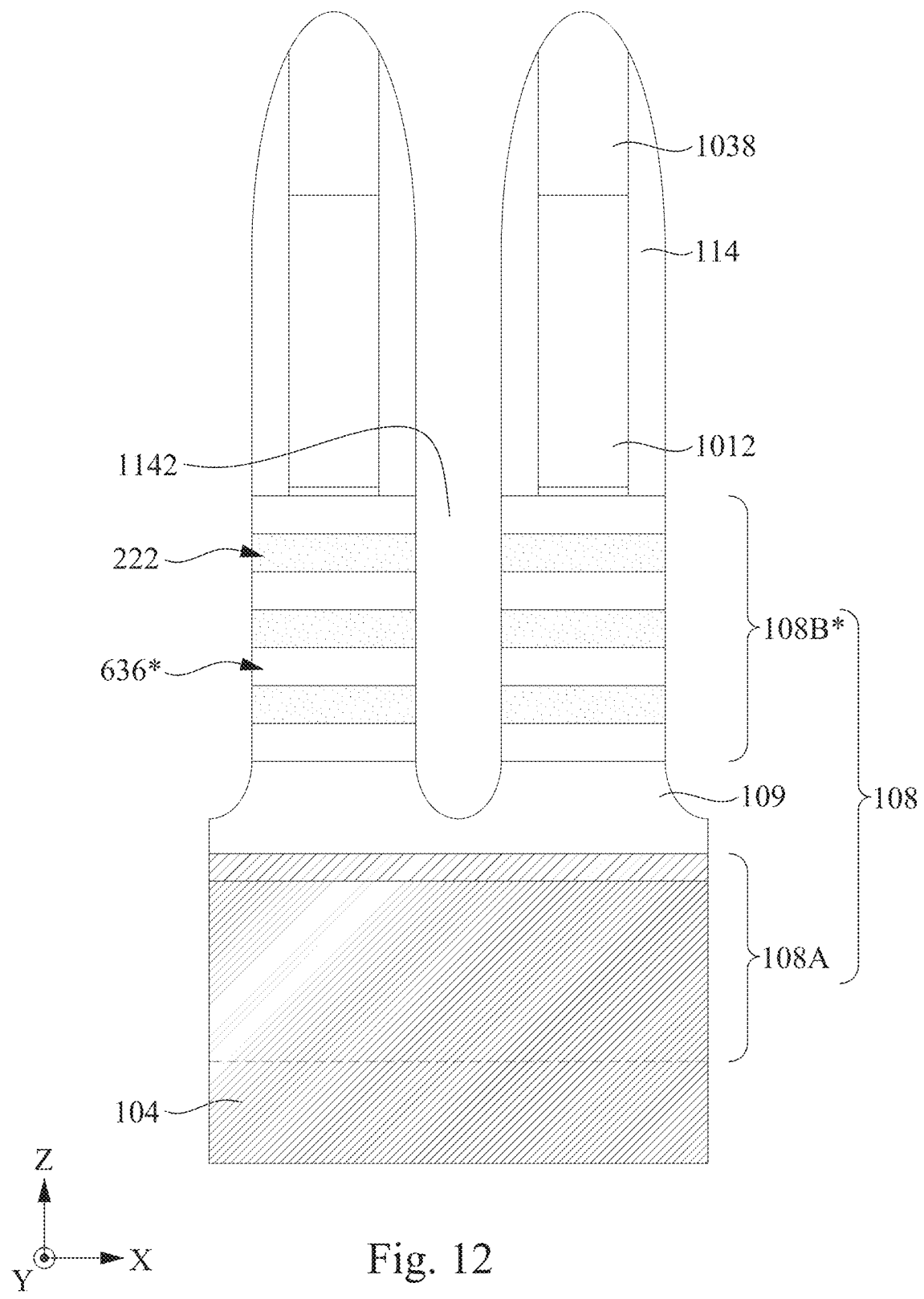

The formation of sacrificial gate structures 1012 can be followed by fabrication of inner spacer structures 224. The fabrication of inner spacer structures 224 can include vertical etch of stacked fin portion 108B*, lateral recess of semiconductor layers 636*, and formation of inner spacer structures 224, as shown in FIGS. 11-16. Semiconductor layers 636* and 222 can be vertically etched between sacrificial gate structures 1012 to form openings 1142, as shown in FIGS. 11 and 12. FIG. 12 illustrates a cross-sectional view along line C-C in FIG. 11 along fin structures 108, according to some embodiments. In some embodiments, the vertical etch of semiconductor layers 222 and 636* can include a biased etching process. In some embodiments, the biased etching process can be directional and semiconductor layers 222 and 636* can have substantially no lateral etch. In some embodiments, the biased etching process can be controlled by time and an over etch can form a dip in epitaxial buffer layer 109.

Figure 13:
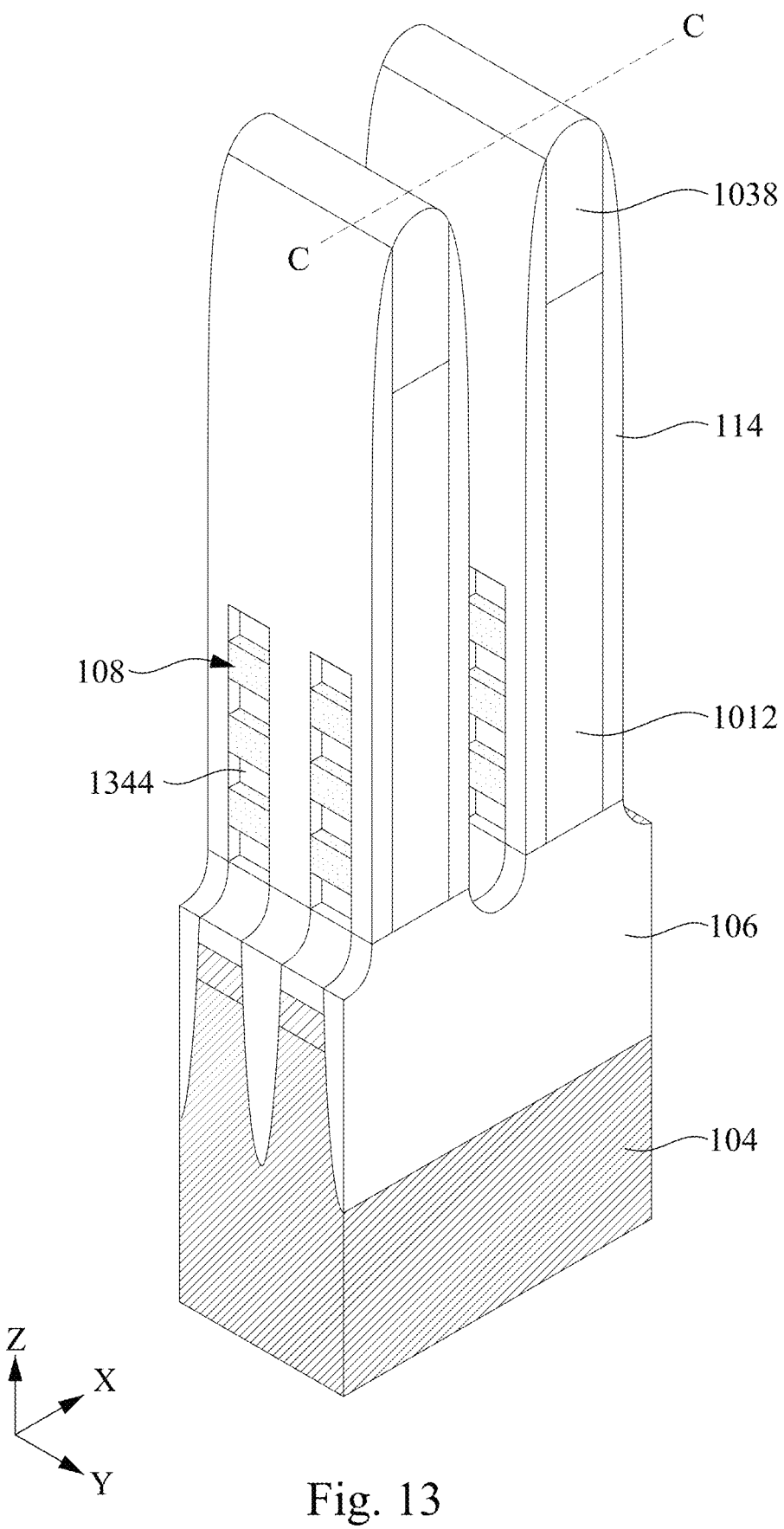
Figure 14:
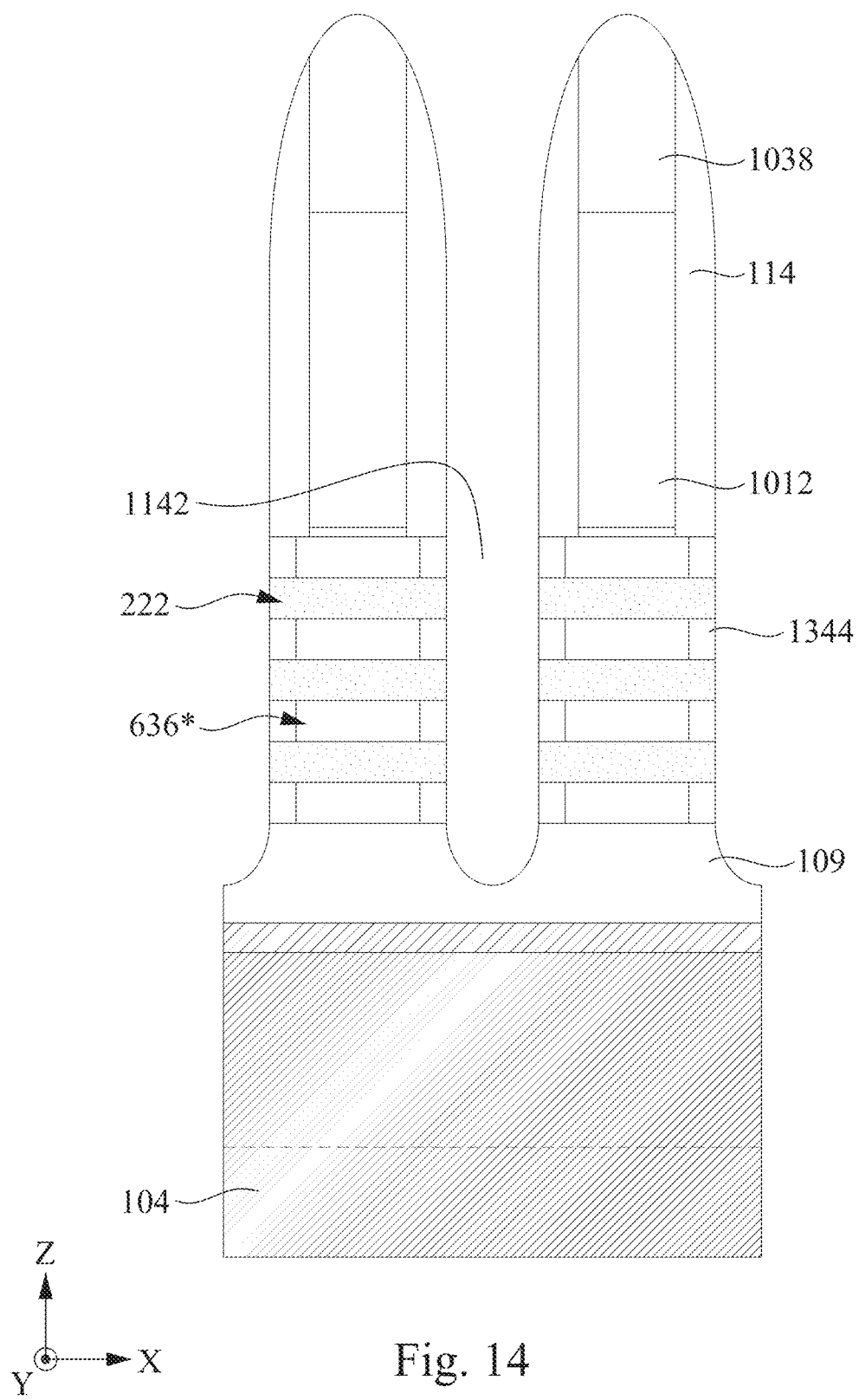

The vertical etch of stacked fin portion 108B* can be followed by the lateral recess of semiconductor layers 636*, as shown in FIGS. 13 and 14. FIG. 14 illustrates a cross-sectional view along line C-C in FIG. 13 along fin structures 108, according to some embodiments. In some embodiments, semiconductor layers 636* can be laterally recessed by a wet etching process or a dry etching process. The wet etching process can include etchants, such as hydrogen peroxide ($H_2O_2$). The dry etching process can include a radiofrequency (RF) plasma of nitrogen trifluoride ($NF_3$), tetrafluoromethane ($CF_4$), or chlorine ($Cl_2$). In some embodiments, semiconductor layers 222 can have a tin concentration from about 7% to about 10% to increase etch selectivity between semiconductor layers 636* and 222. In some embodiments, semiconductor layers 636* can be slightly doped to increase etch selectivity between semiconductor layers 636* and 222. For example, semiconductor layers 636* can be doped with boron having a concentration from about $1\times10^{20}$ atoms/$cm^3$ to about $5\times10^{20}$ atoms/$cm^3$. In some embodiments, instead of etching semiconductor layers 636*, semiconductor layers 222 can be laterally recessed and subsequently removed by a dry etching process to form a germanium nanowire/nanosheet channel. The dry etching process to remove semiconductor layers 222 can include a radiofrequency (RF) plasma of chlorine ($Cl_2$). After the lateral recess of semiconductor layers 636*, recess 1344 can be formed between semiconductor layers 222.

Figure 15:
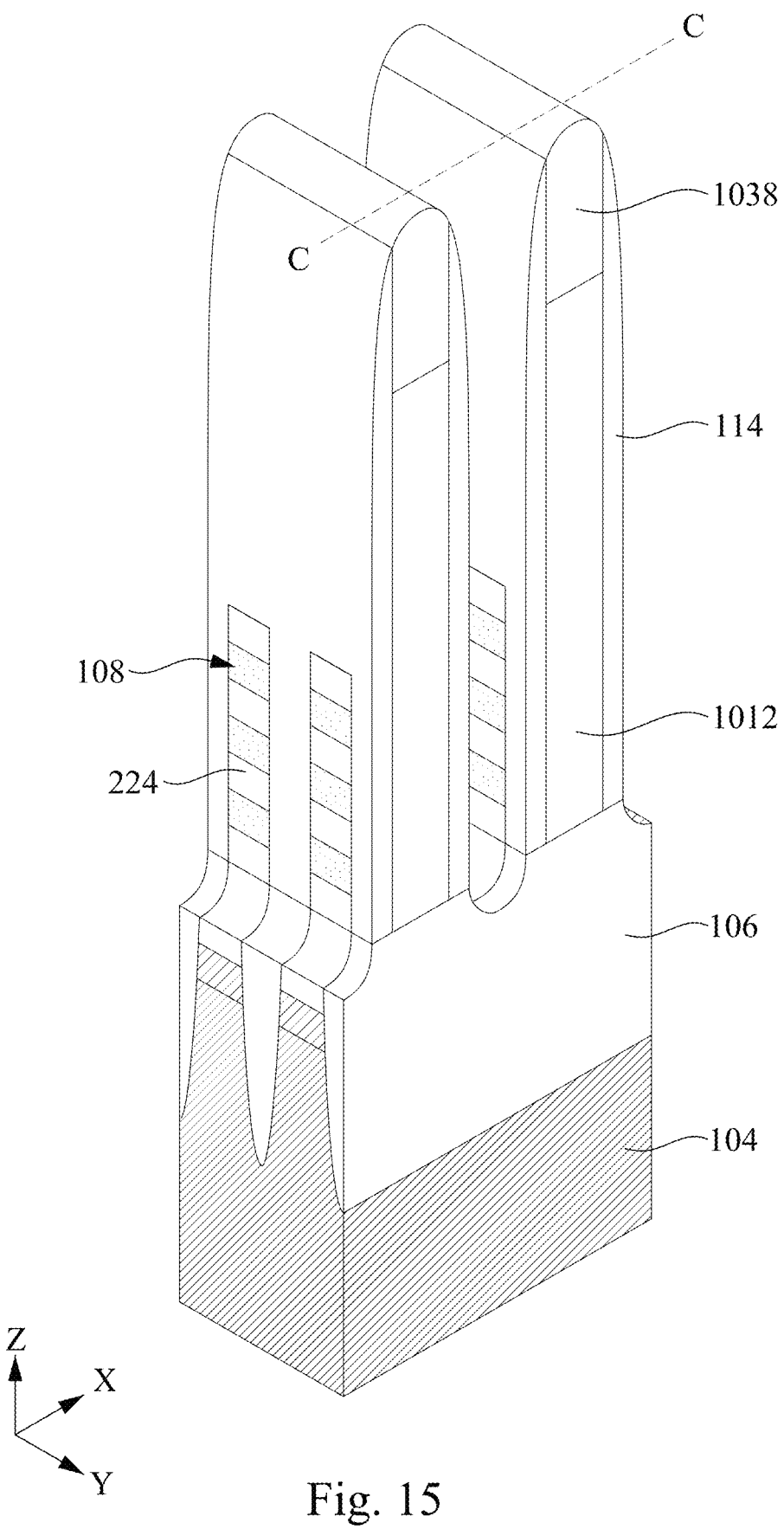
Figure 16:
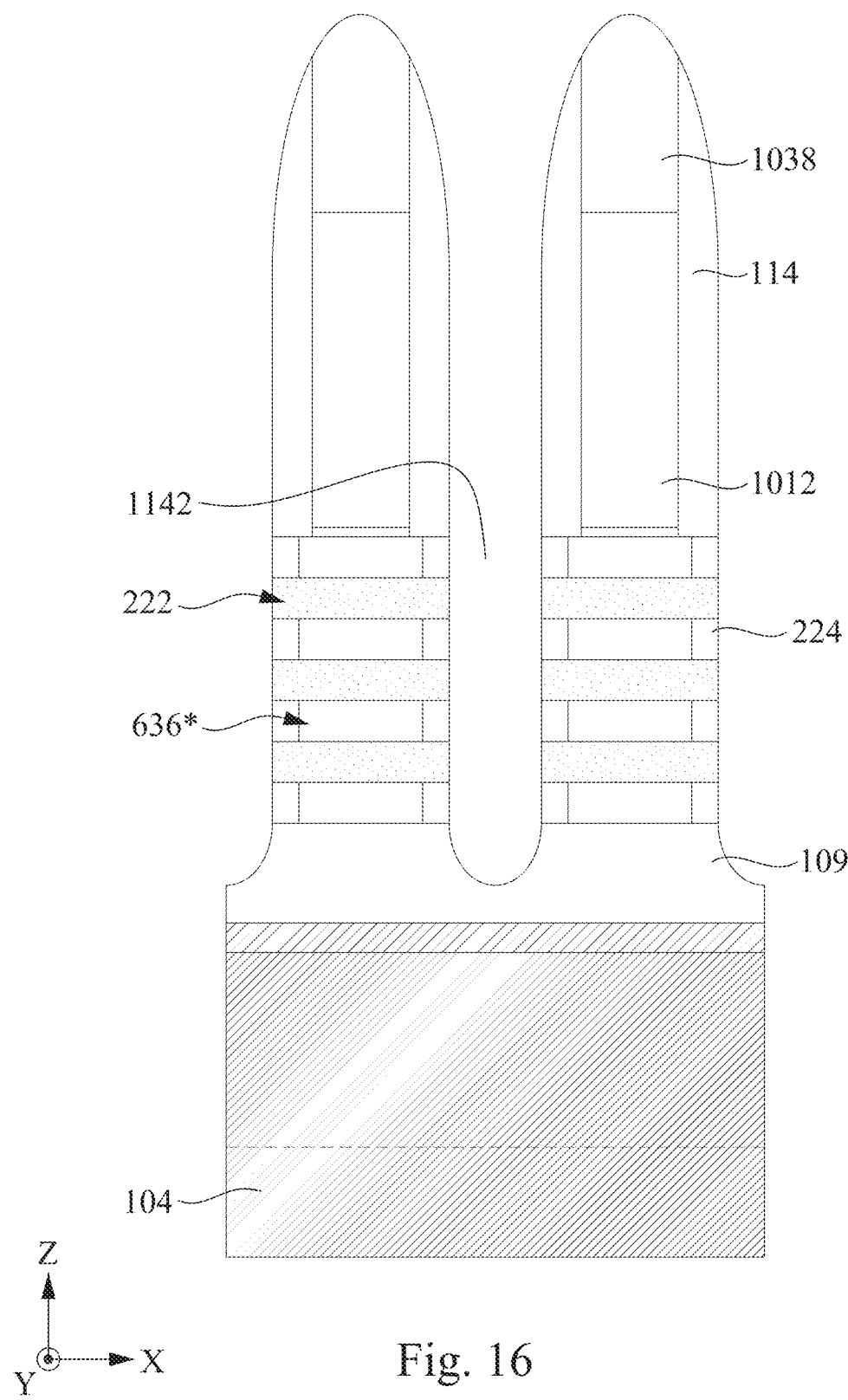

The lateral recess of semiconductor layers 636* can be followed by the formation of inner spacer structures 224, as shown in FIGS. 15 and 16. FIG. 16 illustrates a cross-sectional view along line C-C in FIG. 15 along fin structures 108, according to some embodiments. In some embodiments, the formation of inner spacer structures 224 can include a blanket deposition of an inner spacer layer and a directional etch of the inner spacer layer. In some embodiments, the inner spacer layer can include a single layer or a stack of dielectric layers, deposited by atomic layer deposition (ALD), chemical vapor deposition (CVD), or other suitable methods. In some embodiments, the inner spacer layer can include a dielectric material, such as silicon oxynitride (SiON), silicon carbonitride (SiCN,), silicon oxycarbide (SiOC), silicon oxycarbonitride (SiOCN), silicon nitride ($SiN_x$), silicon oxide ($SiO_x$), and a combination thereof. The blanket deposition can fill recess 1344 with the dielectric material and cover exposed surfaces of finFETs 102A-102B. The directional etch of the inner spacer layer can be performed by a dry etch process using a gas mixture of HF and $NH_3$. After the directional etch process, inner spacer structures 224 can be formed between semiconductor layers 222 and adjacent to semiconductor layers 636*.

Figure 17:
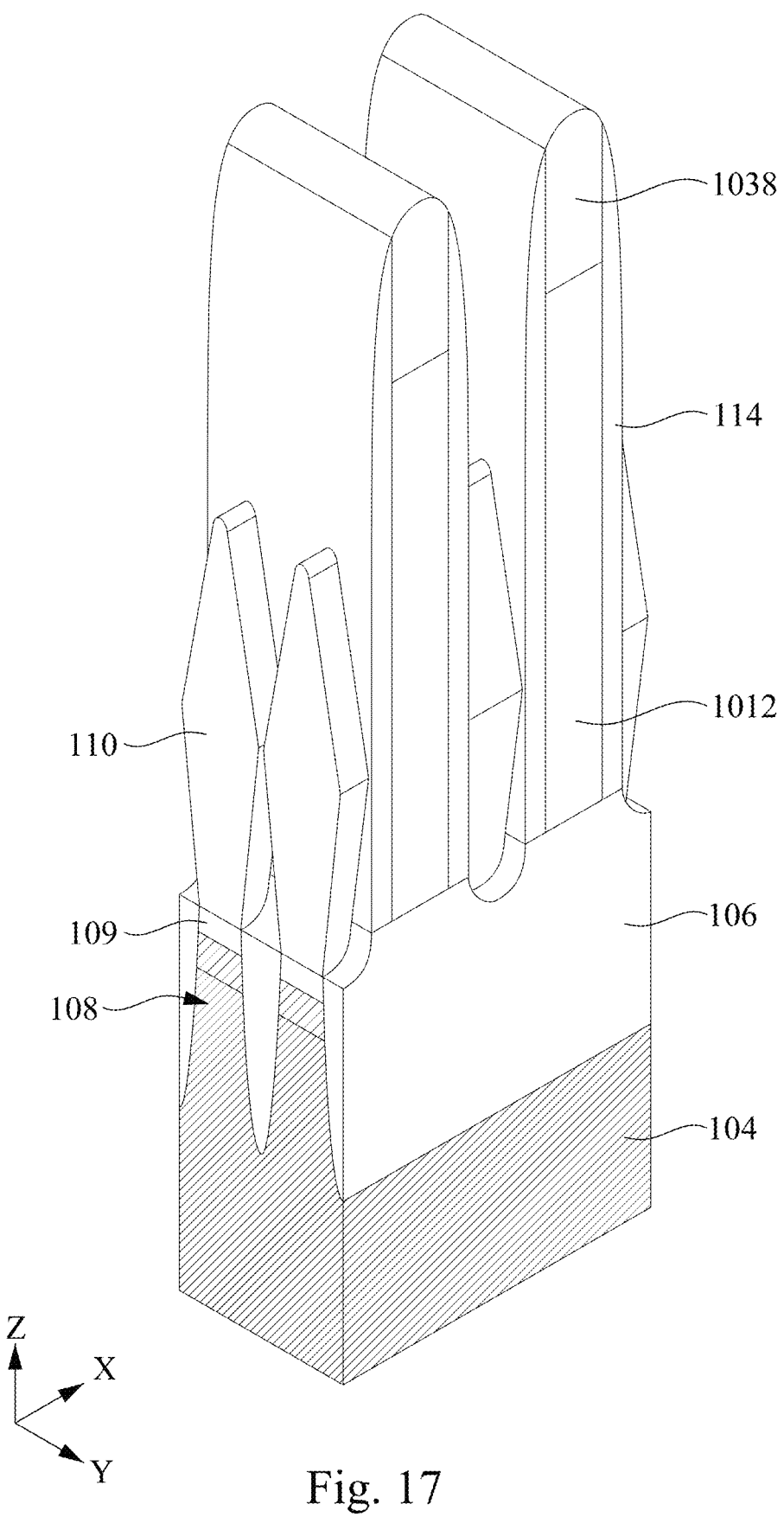

Referring to FIG. 5, in operation 530, an epitaxial structure is formed on the buffer layer and in contact with the second semiconductor layer. The epitaxial structure includes germanium and tin. For example, as shown in FIG. 17, S/D epitaxial structures 110 can be formed on epitaxial buffer layer 109 and in contact with semiconductor layers 222. S/D epitaxial structures 110 can be epitaxially grown at a temperature from about 250° C. to about 500° C. under a pressure ranging from about 10 torr to about 300 torr. S/D epitaxial structures 110 can be grown by atomic layer deposition (ALD), molecular beam epitaxy (MBE), chemical vapor deposition (CVD), remote plasma CVD (RPCVD), and other suitable deposition methods. S/D epitaxial structures 110 can include germanium and tin and can be epitaxially grown using precursors including germane ($GeH_4$), digermane (Ge$_2$H$_6$), tin chloride (SnCl$_4$), hydrogen chloride (HCl), and H$_2$. For n-type S/D epitaxial structures 110, the epitaxial growth process can further include an n-type precursor, such as phosphine (PH$_3$) and arsine (AsH$_3$) to dope S/D epitaxial structures 110 during their epitaxial growth. For p-type S/D epitaxial structures 110, the epitaxial growth process can further include a p-type precursor, such as diborane (B$_2$H$_6$) to dope S/D epitaxial structures 110 during their epitaxial growth. In some embodiments, S/D epitaxial structures 110 can include GeSn having a Sn concentration from about 2% to about 12% to increase carrier mobility, such as hole mobility. In some embodiments, n-type S/D epitaxial structures 110 can be have a boron concentration from about $1 \times 10^{20}$ atoms/cm$^3$ to about $2 \times 10^{21}$ atoms/cm$^3$. In some embodiments, p-type S/D epitaxial structures 110 can have a phosphorus concentration from about $1 \times 10^{20}$ atoms/cm$^3$ to about $5 \times 10^{21}$ atoms/cm$^3$.

Figure 18:
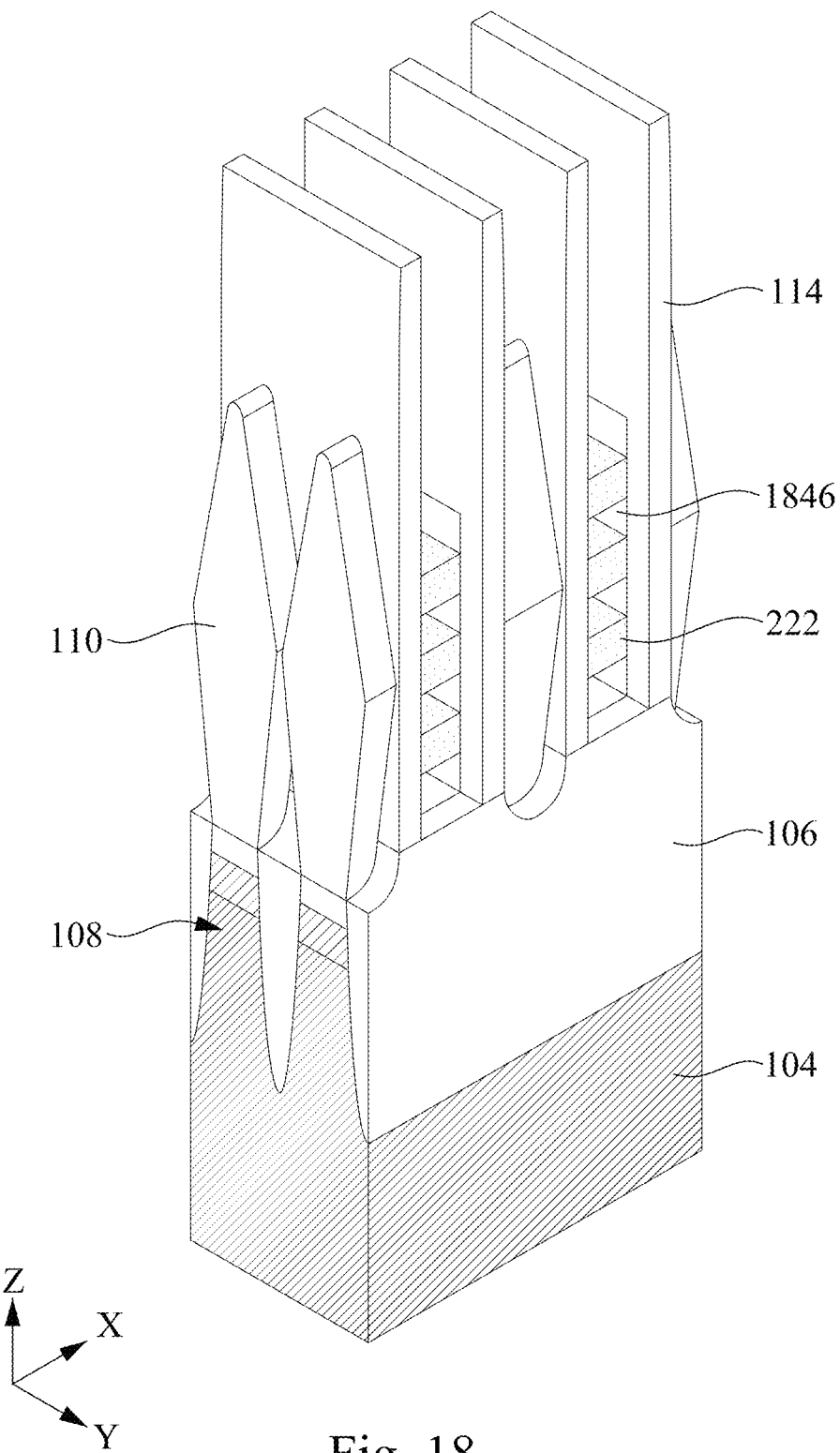

Referring to FIG. 5, in operation 540, a gate structure is formed wrapping around a portion of the second semiconductor layer. For example, as shown in FIGS. 1, 2, and 18, gate structures 112 can be formed wrapping around a portion of semiconductor layers 222. The formation of gate structure an include removal of sacrificial gate structures 1012, removal of semiconductor layers 636*, and deposition of gate structures 112. As shown in FIG. 18, sacrificial gate structures 1012 and hard mask layer 1038 can be removed to expose semiconductor layers 636*. The remaining portion of semiconductor layers 636* can be removed by an etching process similar to the lateral recess of semiconductor layers 636* to form an opening 1846. After removal of semiconductor layers 636*, nanowires/nanosheets of semiconductor layers 222 can be formed.

The deposition of gate structures 112 can include formation of gate dielectric layer 226 and formation of gate electrode 228 in opening 1846 formed by removal of the remaining portion of semiconductor layers 636*. Gate dielectric layer 226 can wrap around each of semiconductor layers 222, and thus electrically isolate semiconductor layers 222 from each other and from conductive gate electrode 228 to prevent shorting between gate structures 112 and semiconductor layers 222 during operation of finFETs 102A-102B. In some embodiments, gate dielectric layer 226 can include an interfacial layer and a high-k layer. In some embodiments, the interfacial layer can include silicon oxide or germanium tin oxide (GeSnO$_2$). In some embodiments, the high-k layer can include aluminum oxide (Al$_2$O$_3$), hafnium oxide (HfO$_2$), zirconium oxide (ZrO$_2$), and or suitable high-k dielectric materials. In some embodiments, gate electrode 228 can include aluminum (Al), titanium nitride (TiN), tantalum nitride (TaN), tungsten (W), copper (Cu), and other suitable conductive materials.

The formation of gate structures 112 can be followed by formation of contact structures 230 on S/D epitaxial structures 110, as shown in FIG. 2. The formation of contact structures 230 can include formation of metal-semiconductor alloy/compound material layer 232 and formation of metal contact 234. The formation of metal-semiconductor alloy/compound material layer 232 can include depositing a layer of metal, such as titanium (Ti), nickel (Ni), and other suitable metals, on S/D epitaxial structures 110 followed by a thermal anneal process. Metal-semiconductor alloy/compound material layer 232 can include a compound of germanium and the metal. In some embodiments, metal-semiconductor alloy/compound material layer 232 on n-type S/D epitaxial structures 110 can include TiGe having about 20% to about 30% Ti. In some embodiments, metal-semiconductor alloy/compound material layer 232 on p-type S/D epitaxial structures 110 can include NiGe having about 20% to about 30% Ni. Metal contact 234 can be deposited on metal-semiconductor alloy/compound material layer 232 and can include a metal, such as platinum (Pt), Co, W, Al, ruthenium (Ru), and other suitable metals.

Various embodiments in the present disclosure provide methods for forming a GeSn GAA semiconductor device 100. In some embodiments, semiconductor device 100 can include fin structures 108 and S/D epitaxial structures 110 having GeSn. The example methods to form semiconductor device 100 in the present disclosure can form epitaxial buffer layer 109* on substrate 104, as shown in FIGS. 6 and 7. Epitaxial buffer layer 109* can include Ge to reduce dislocation defects. In some embodiments, epitaxial buffer layer 109* can include multiple sublayers having gradient Ge concentrations to further reduce dislocation defects. As shown in FIG. 9, stacked fin portion 108B* of fin structures 108 can be formed on epitaxial buffer layer 109 and stacked fin portion 108B* can include semiconductor layers 636 and semiconductor layers 222*. Semiconductor layers 636 can include Ge and semiconductor layers 222* can include GeSn. In some embodiments, semiconductor layers 222* can have a concentration of Sn ranging from about 2% to about 12% to increase carrier mobility, such as hole mobility. In some embodiments, semiconductor layers 222* can have a concentration of Sn ranging from about 7% to about 10% to increase etching selectivity between GeSn and Ge and to improve process window. As shown in FIG. 2, S/D epitaxial structures 110 can be formed on epitaxial buffer layer 109 in contact with the semiconductor layers 222 and gate structures 112 can be formed wrapping around a portion of semiconductor layers 222. S/D epitaxial structures 110 can include GeSn and a dopant. In some embodiments, p-type S/D epitaxial structures 110 can include a p-type dopant, such as boron (B), and n-type S/D epitaxial structures 110 can include an n-type dopant, such as phosphorus (P) and arsenic (As). Compared with Ge, GeSn can increase carrier mobility in semiconductor layers 222 by about two to about five times. GeSn GAA semiconductor device 100 can reduce SCEs and improve device performance. In some embodiments, semiconductor device can increase Ion/Ioff ratio by about 3% to about 8% compared to Si or SiGe based GAA semiconductor devices.

In some embodiments, a semiconductor device includes a substrate, a buffer layer on the substrate, and a stacked fin structure on the buffer layer. The buffer layer include germanium and the stacked fin structure includes a semiconductor layer including germanium and tin. The semiconductor device further includes a gate structure wrapped around a portion of the semiconductor layer and an epitaxial structure on the buffer layer and in contact with the semiconductor layer. The epitaxial structure includes germanium and tin.

In some embodiments, a semiconductor device includes a substrate, a buffer layer on the substrate, and first and second stacked fin structures on the buffer layer. The buffer layer include germanium. The first and second stacked fin structures include first and second multiple semiconductor layers. Each of the first and second multiple semiconductor layers includes germanium and tin. The semiconductor device further includes a first gate structure wrapped around a first portion of the first multiple semiconductor layers and a second gate structure wrapped around a second portion of the second multiple semiconductor layers. The semiconductor device further includes a first epitaxial structure on the buffer layer and in contact with the first multiple semiconductor layers and a second epitaxial structure on the buffer layer and in contact with the second multiple semiconductor layers. The first epitaxial structure includes germanium, tin, and a first dopant. The second epitaxial structure includes germanium, tin, and a second dopant different from the first dopant.

In some embodiments, a method includes forming, on a substrate, a buffer layer including germanium and forming a stacked fin structure on the buffer layer. The stacked fin structure includes a first semiconductor layer including germanium and a second semiconductor layer including germanium and tin. The method further includes forming an epitaxial structure on the buffer layer and in contact with the second semiconductor layer and forming a gate structure wrapped around a portion of the second semiconductor layer. The epitaxial structure includes germanium and tin.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, on a substrate, a buffer layer comprising germanium;
   annealing the buffer layer under a thermal condition;
   forming a stacked semiconductor layers on the annealed buffer layer, wherein the stacked semiconductor layers comprise a first semiconductor layer comprising germanium and a second semiconductor layer comprising germanium and tin; and
   forming an epitaxial structure in physical contact with the annealed buffer layer and one of the first and second semiconductor layers, wherein the epitaxial structure comprises germanium and tin.

2. The method of claim 1, further comprising epitaxially growing a seed layer on the substrate, wherein the seed layer has a same composition as the substrate.

3. The method of claim 2, wherein forming the buffer layer comprises epitaxially depositing the buffer layer on the seed layer.

4. The method of claim 1, wherein forming the buffer layer comprises:
   epitaxially depositing a first sublayer on the substrate; and
   epitaxially depositing a second sublayer on the first sublayer, wherein the first and second sublayers have gradient germanium concentrations.

5. The method of claim 1, further comprising:
   depositing a layer of metal on the epitaxial structure; and
   treating the layer of metal and the epitaxial structure with a thermal anneal process.

6. The method of claim 1, further comprising forming a gate structure in contact with the buffer layer and wrapped around the second semiconductor layer.

7. The method of claim 6, wherein forming the gate structure comprises removing the first semiconductor layer to form an opening and forming the gate structure in the opening wrapped around the second semiconductor layer.

8. The method of claim 1, further comprising:
   removing a portion of the first semiconductor layer to form a recess; and
   forming an inner spacer structure in the recess.

9. The method of claim 1, wherein forming the epitaxial structure comprises:
   removing a portion of the first and second semiconductor layer to form an opening exposing the buffer layer; and
   epitaxially depositing the epitaxial structure on the exposed buffer layer.

10. A method, comprising:
    forming a buffer layer on a substrate, wherein the buffer layer comprises germanium;
    forming first and second stacked fin structures on the buffer layer, wherein the first and second stacked fin structures comprise first and second plurality of semiconductor layers, respectively, and wherein each of the first and second plurality of semiconductor layers comprises germanium and tin;
    forming a first epitaxial structure on the buffer layer and in contact with the first plurality of semiconductor layers, wherein the first epitaxial structure comprises germanium, tin, and a first dopant; and
    forming a second epitaxial structure on the buffer layer and in contact with the second plurality of semiconductor layers, wherein the second epitaxial structure comprises germanium, tin, and a second dopant different from the first dopant.

11. The method of claim 10, further comprising epitaxially growing a seed layer on the substrate, wherein the seed layer has a same composition as the substrate.

12. The method of claim 11, wherein forming the buffer layer comprises:
    epitaxially depositing the buffer layer on the seed layer; and
    annealing the buffer layer under a thermal condition.

13. The method of claim 10, further comprising forming a first contact structure on the first epitaxial structure and a second contact structure on the second epitaxial structure, wherein the first and second contact structures comprise germanium.

14. The method of claim 10, wherein forming the first epitaxial structure comprises:
    removing a portion of the first stacked fin structures to form an opening exposing the buffer layer; and
    epitaxially depositing the first epitaxial structure on the exposed buffer layer.

15. The method of claim 10, wherein forming the buffer layer comprises:
    epitaxially depositing a first sublayer on the substrate; and
    epitaxially depositing a second sublayer on the first sublayer, wherein the first and second sublayers have gradient germanium concentrations.

16. A semiconductor device, comprising:
    a seed layer on a substrate, wherein the seed layer and the substrate comprises a first semiconductor material;
    a buffer layer on the seed layer, wherein the buffer layer comprises a second semiconductor material different from the first semiconductor material;

a stacked fin structure on the buffer layer, wherein the stacked fin structure comprises a semiconductor layer comprising germanium and tin; and an epitaxial structure in physical contact with the buffer layer and the semiconductor layer, wherein the epitaxial structure comprises germanium and tin.

17. The semiconductor device of claim 16, wherein a concentration of tin in the epitaxial structure is lower than a concentration of tin in the semiconductor layer.

18. The semiconductor device of claim 16, wherein a concentration of tin in the semiconductor layer ranges from about 7% to about 10%.

19. The semiconductor device of claim 16, wherein a thickness of the buffer layer ranges from about 50 nm to about 500 nm.

20. The semiconductor device of claim 16, wherein the buffer layer comprises a stack of sublayers and each sublayer comprises germanium at a concentration different from each other.

* * * * *